(12) United States Patent
Lee

(10) Patent No.: US 6,710,629 B2
(45) Date of Patent: Mar. 23, 2004

(54) IMPEDANCE COMPARISON INTEGRATOR CIRCUIT

(75) Inventor: Sang-Chuel Lee, Anyang-si (KR)

(73) Assignee: Ad Semicon Co., Ltd. (KR)

( * ) Notice: Subject to any disclaimer, the term of this patent is extended or adjusted under 35 U.S.C. 154(b) by 0 days.

(21) Appl. No.: 10/308,666

(22) Filed: Dec. 3, 2002

(65) Prior Publication Data
US 2004/0008058 A1 Jan. 15, 2004

(30) Foreign Application Priority Data
Jul. 11, 2002 (KR) ......................... 2002-40261

(51) Int. Cl.[7] ............... G01R 19/00; H03K 17/945
(52) U.S. Cl. ..................... 327/58; 327/89; 327/517
(58) Field of Search .................... 327/517, 58, 78, 327/62, 89, 65

(56) References Cited

U.S. PATENT DOCUMENTS 5,243,235 A * 9/1993 Wakayama et al. ........... 327/92
5,463,333 A * 10/1995 Calder et al. ................ 327/78
5,923,216 A * 7/1999 Pennock ..................... 330/255

* cited by examiner

Primary Examiner—Tuan T. Lam
(74) Attorney, Agent, or Firm—Cantor Colburn LLP

(57) ABSTRACT

Disclosed is an impedance comparison integrated circuit. The integrated circuit includes a current mirror part, a discharging part, a differential amplification part and a first output part. The current mirror part provides current to a first and second input terminal, respectively, during a first interval of every period. The discharging part provides a discharging path to the first and second input terminals, respectively, during a second interval of every period. The differential amplification part performs a differential amplification on signals input from the first and second input terminals, respectively, during the first interval of every period. The first output part outputs a first output signal to the first output terminal in response to the differential amplification part. Accordingly, parasitic impedance difference between each parasitic impedance of the first and second input terminals is minimized, and input offset error is reduced, so that impedance sensing with high precision is possible.

22 Claims, 28 Drawing Sheets

IMPEDANCE COMPARISON INTEGRATOR CIRCUIT

BACKGROUND OF THE INVENTION

1. Field of the Invention

The disclosure relates to an impedance comparison integrated circuit, and more particularly to an impedance comparison integrated circuit for interfacing a sensed signal of a capacitive touch sensor.

2. Description of the Related Art

In general, an impedance comparator detects variation of capacitance induced between a user and an electrode when the user's approaching the impedance comparator, detects minute variation of resistance induced by variation of an external environment such as variation of humidity, or detects variation of inductance. Also, the impedance comparator may detect variation of complex impedance.

Recently, switches for an LCD monitor have been changed from a conventional push switch type to a touch switch type as.

In the touch switch type switch, electrodes are installed in a front cover of the touch switch product, the switch senses variation of capacitance induced between the electrodes and user when the user touches around the electrodes, and the switch transfers the sensed signal to a microprocessor or a microcomputer etc.

Accordingly, the front cover becomes thicker according as home appliances becomes larger, the capacitance of the touch switch decreases, and the sensed capacitance value has very minute variation, so that there is required a more precise detection of capacitance variation.

In addition, many countries have restricted power consumption of home appliances, especially power consumption in a standby state.

According to the conventional impedance comparison method, a measurement capacitor used for measurement is charged and discharged by current, the frequency or time of the charging and the discharging operation is measured, and the capacitance value is compared by comparing the measured frequency or time with a reference frequency of reference time. In the conventional impedance comparison method, there exist errors of voltage comparator, reference voltage errors of the charging and discharging operation and time delay errors of the switch that controls the charging and discharging operation, so that these errors lead to very large measurement errors of impedance variation.

FIG. 1 is a circuit diagram showing a conventional impedance comparison circuit for touch switch.

Referring to FIG. 1, according to the conventional impedance comparison circuit, a current source and a measurement capacitor to be measured are connected to each other, the charged voltage level charged in the measurement capacitor and the discharged voltage level discharged from the capacitor are compared by means of voltage comparators (U1A, U1B), and capacitance difference is measured by detecting the charging and discharging frequencies or charging time.

For the purpose of comparing the charged voltage in the reference capacitor (CA) with that of the measurement capacitor (CB), an upper reference voltage (VCH) and an lower reference voltage (VCL) is generated at the comparators (U1A, U1B), are applied to a non-inverting terminal (VIN+) of the comparators, and the charging and discharging control switch should be controlled by logic circuits when the charging and discharging operations is finished.

The input offset error $V_{\_offset}$ of the comparators (U1A, U1B) causes an comparison error of the comparators. Also, reference voltage error $V_{ref\_diff}$ is generated in both comparators (U1A, U1B) because different voltages (VCH, VCL) are applied to the comparators (U1A, U1B), so that the sensed output frequency has errors.

Also, a difference of time (Tcs), which is taken to begin the charging operation, between a reference circuit and a measurement circuit is generated because of a basic transmission delay and a difference of transmission path, so that output errors increase.

Accordingly, the final output error ($T_{\_out\_err}$) is shown as follows.

$$T_{\_out\_err} \propto 2 \times V_{\_offset} + 4 \times V_{ref\_diff} + 2 \times Tcs \qquad \text{Expression 1}$$

According to another conventional impedance comparison circuit that has a voltage comparator (or inverter) and compares the frequency or charging time for the purpose of measuring capacitance variation, there is generated an output error similar to the expression 1. Therefore, in order to use a capacitance comparator with a high precision, another adjustments are required, and manufacturing cost increases. Power consumption of the comparator increases because current source for charging operation is in a turn-on state during the charging and discharging operation.

BRIEF SUMMARY OF THE INVENTION

The present invention provides an impedance comparison integrated circuit for detecting impedance variations with a high precision.

The present invention provides an impedance comparison integrated circuit having minimized power consumption.

In one aspect of the invention, there is provided an impedance comparison integrated circuit comprising: a current mirror means for providing current to a first input terminal and a second input terminal, respectively, during a first interval of every period; a discharging means for providing a discharging path to the first and the second input terminals, respectively, during a second interval of the every period; a differential amplification means for performing a differential amplification on signals input from the first and the second input terminals, respectively, during the first interval of the every period; and a first output means for outputting a first output signal to the first output terminal in response to the differential amplification means.

The current mirror means comprises: a first current source for generating an output current corresponding to a reference current provided by a bias resistor; a current sink section for providing a sink current corresponding to the output current of the first current source; and a second current source for providing currents to the first and the second input terminals, respectively, in response to the sink current.

The current mirror means further comprises a mode switching means, the mode switching means maintaining the current sink section a turn-on state in a high precision mode, turning on the current sink section during the first interval of the every period in the normal mode, and turning off the current sink section during the second interval of the every period in the normal mode.

The current mirror means minimizes a parasitic impedance difference of the integrating circuit for the first and second input terminals, and minimizes power consumption.

The first output means comprises: a first current sink means for providing a first sink current to a first node in response to the first differential amplified current signal; a second current sink means for providing a second sink current to a second node in response to the second differential amplified current signal; a current source coupled between the first node and a second node; and a capacitor coupled to the first node, for charging a current provided to the first node. Accordingly, the capacitor of the first output means prevents the chattering of the output signal.

The impedance comparison integrated circuit further comprises: a buffer means for buffering an output signal of the capacitor; a schmitt trigger means for performing a schmitt triggering operation on an output signal of the buffer means; and a second output means for outputting an output signal of the schmitt trigger means to a second output terminal.

The buffer means comprises: a first buffer coupled to the first node, for buffering the first output signal; and a second buffer coupled to the second node, for compensating a current loss of the first node due to the first buffer.

The first output means comprises: a first driving means for providing a sink current corresponding to the first differential amplified current signal to the first output terminal in a normal mode, the first driving means providing the sink current corresponding to the first differential amplified current signal to the first output terminal during the first interval of the every period in a high precision mode, and the first driving means providing a source current corresponding to the first differential amplified current signal to the first output terminal during the second interval in the high precision mode; and a second driving means for providing a source current corresponding to the second differential amplified current signal to the first output terminal in the normal mode, the second driving means providing the source current corresponding to the second differential amplified current signal to the first output terminal during the first interval of the every period in the high precision mode, and the second driving means providing a sink current corresponding to the second differential amplified current signal to the first output terminal during the second interval in the high precision mode.

The impedance comparison integrated circuit further comprises: a clock generating means for generating a clock signal having a predetermined period; a timing control means for receiving the clock signal and generating a timing control signal having a first interval and a second interval; a control input terminal for receiving an external control signal which selects the normal mode and the high precision mode; and a mode control signal generating means for generating a mode control signal base on the external control signal and the timing control signal so as to control the normal mode and the high precision mode. The normal mode begins when the control input terminal is connected to a pull up circuit and the control input terminal is left in a floating state. Also, the high precision mode begins when the control input terminal is connected to a pull down circuit and the control input terminal is left in a floating state.

The first input terminal and the second input terminal is disposed symmetrically with respect to a power terminal in a package so as to minimize a difference of parasitic impedance between the first input terminal and the second input terminal.

In another aspect, there is provided an impedance comparison integrated circuit package having an impedance comparison integrated circuit chip, wherein one chip or even number of chips is packaged in a body, first input pins and first output pins of at least one first chips is arranged in a first side of the package, second input pins and second output pins of at least one second chips corresponding to the first chips is arranged in a second side of the package.

The first and the second input pins are disposed symmetrically with respect to at least one pins in the first and second side of the package, or are disposed parallel.

In further aspect, there is provided a touch switch. The touch switch comprises: a case having a cubic shape, a horizontal supporting plate being disposed in the case, a lower space section formed on a lower surface of the horizontal supporting plate, and a upper space section formed on a upper surface of the horizontal supporting plate; a printed circuit board mounted on the horizontal supporting plate, the printed circuit board having a plurality of external lead lines projected toward the lower space section through the horizontal supporting plate, and an impedance comparison integrated circuit chip being mounted on the printed circuit board; a conductive elastic terminal installed on the printed circuit board, and projected toward the upper space section; and a insulating substrate installed on the case, the insulating substrate having a lower electrode layer and a upper electrode layer, the lower electrode layer being formed on a lower surface of the insulating substrate and being electrically connected to the conductive elastic terminal, and the upper electrode being formed on a upper surface of the insulating substrate and being externally touchable.

Preferably, a conductive elastic body is coupled to the upper electrode layer, a conductive pole is coupled to a center of the upper electrode layer, and the conductive pole is covered with a conductive rubber cap.

In further aspect, there is provided touch switch comprising: a case having a cubic shape, a horizontal supporting plate being disposed in the case, a lower space section formed on a lower surface of the horizontal supporting plate, and a upper space section formed on a upper surface of the horizontal supporting plate; a printed circuit board mounted on the case, the printed circuit board having a plurality of external lead lines projected toward the lower space section through the horizontal supporting plate, and an impedance comparison integrated circuit chip being mounted on a lower surface of the printed circuit board; and a electrode layer formed on the printed circuit board, and being electrically connected to the impedance comparison integrated circuit chip.

According to the impedance comparison integrated circuit of the present invention, a reference impedance device and a comparison impedance device are externally connected to the chip of the impedance comparison integrated circuit, currents are provided by means of current mirrors under same parasitic impedance conditions in the chip. Therefore, the input offset error of the differential amplification circuit is minimized to detect capacitance variation of about 0.01 pF.

Also, impedance variations are detected periodically, current consumption is minimized while sensing operation is not performed, so that a low current consumption, for example about 70 microamperes, can be accomplished.

The touch switch of the present invention minimize errors due to external parasitic impedance, provide impedance comparison with a high precision, can be easily installed, is strong against water and moisture and has a long life time due to a tightly sealed structure especially when used as a switch of home appliances

BRIEF DESCRIPTION OF THE DRAWINGS

The above and other advantages of the present invention will become more apparent by describing in detail exemplary embodiments thereof with reference to the accompanying drawings, in which.

DETAILED DESCRIPTION OF THE PREFERRED EMBODIMENTS

Embodiment 1

Figure 1:
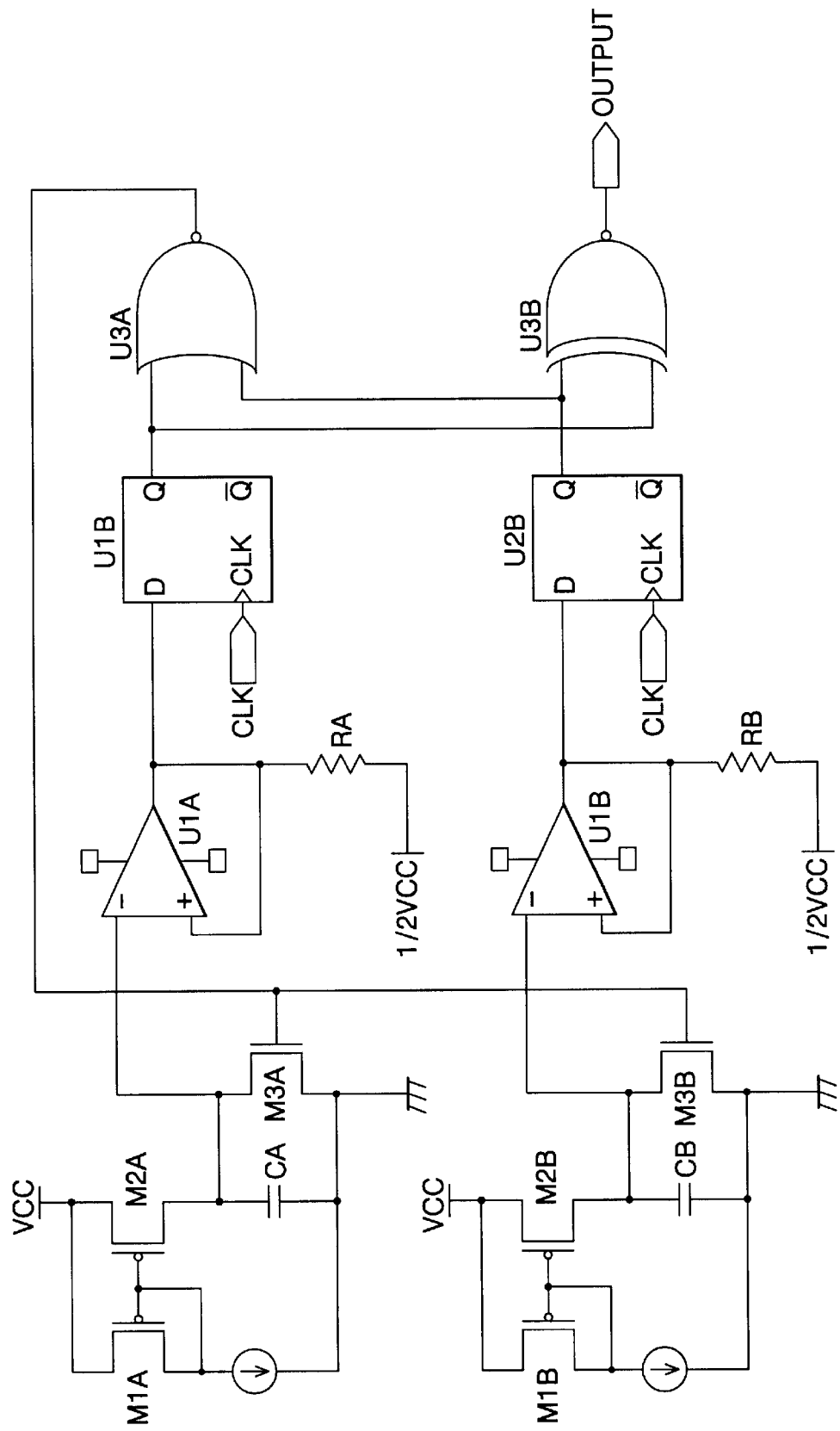
FIG. 1 is a circuit diagram showing a conventional impedance comparison circuit for touch switch.
Figure 2:
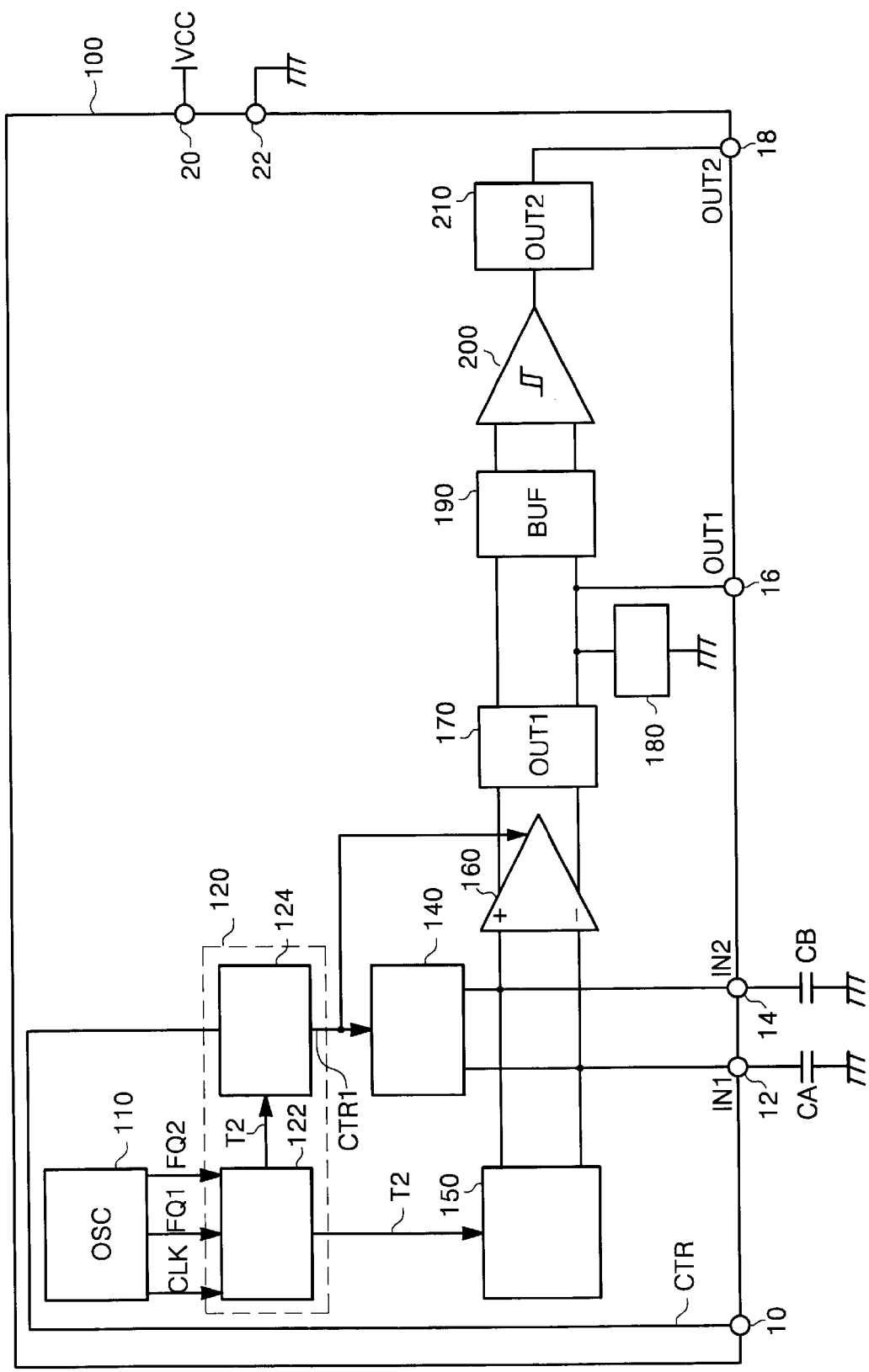
FIG. 2 is a circuit diagram showing an impedance comparison integrated circuit according to one exemplary embodiment of the present invention.

FIG. 2 is a circuit diagram showing an impedance comparison integrated circuit according to one exemplary embodiment of the present invention.

Referring to FIG. 2, the impedance comparison integrated circuit 100 includes a input terminal 10 for inputting an external control signal, a first input terminal 12, a second input terminal 14, a first output terminal 16, a second output terminal 18, a first power terminal 20 and a second power terminal 22. Each of the first input terminal 12 and the second input terminal 14 is connected to an external electrical device with an external impedance, for example a capacitor (CA), and an external electrical device with a sensing impedance, for example a capacitor (CB). A driving voltage VCC is applied to the first power terminal 20, and the second power terminal is connected to a ground.

The impedance comparison integrated circuit 100 includes a clock generator 110, a control signal generating circuit 120, a timing control signal generating circuit 122, a mode control signal generating circuit 124, a current mirror circuit 140, a discharge circuit 150, a differential amplification circuit 160, a first output circuit 170, an integrating circuit 180, a buffer circuit 190, a schmitt trigger circuit 200 and a second output circuit 210.

Figure 3:
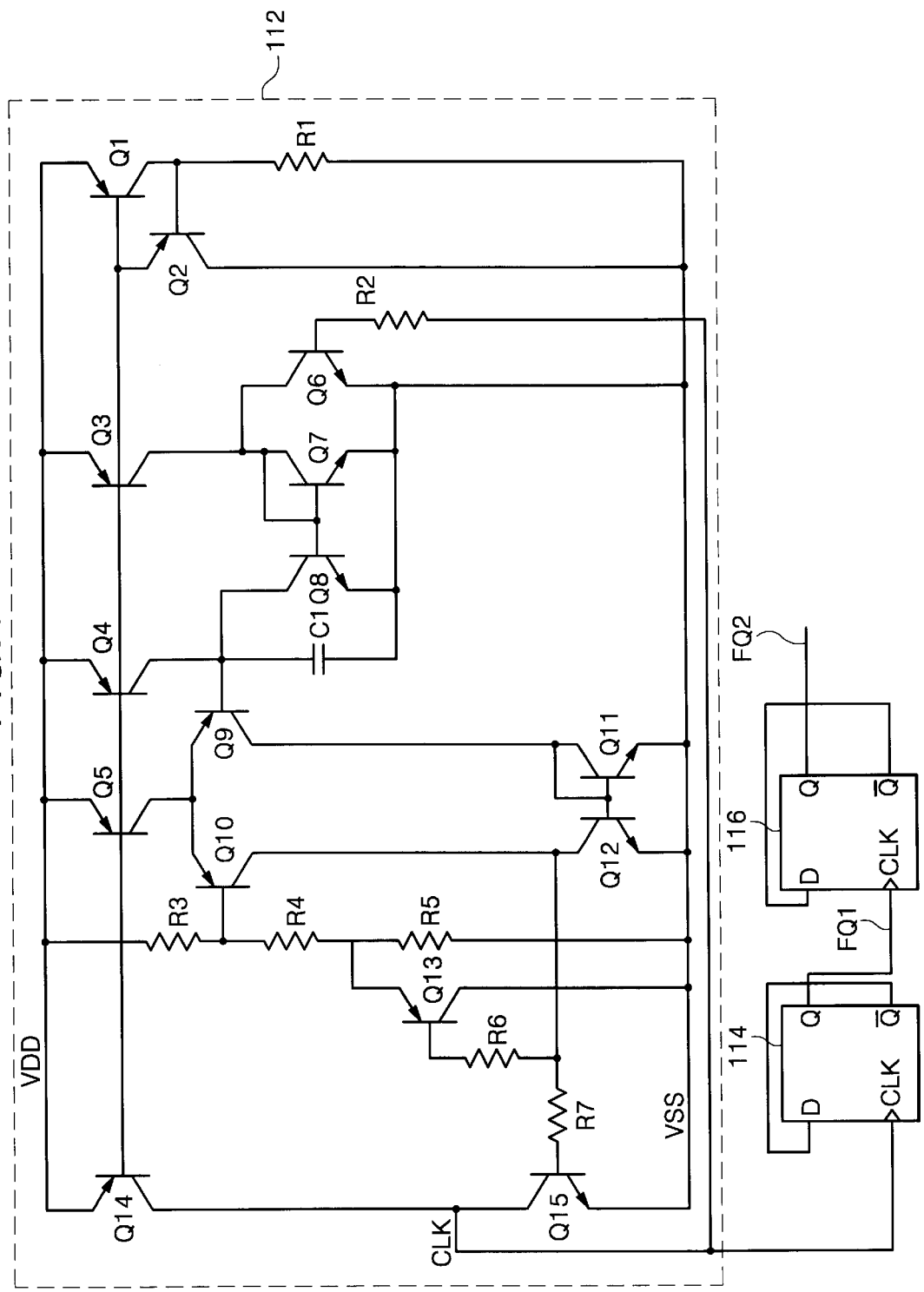
FIG. 3 is a concrete circuit diagram showing a clock generator of FIG. 2.
Figure 4:
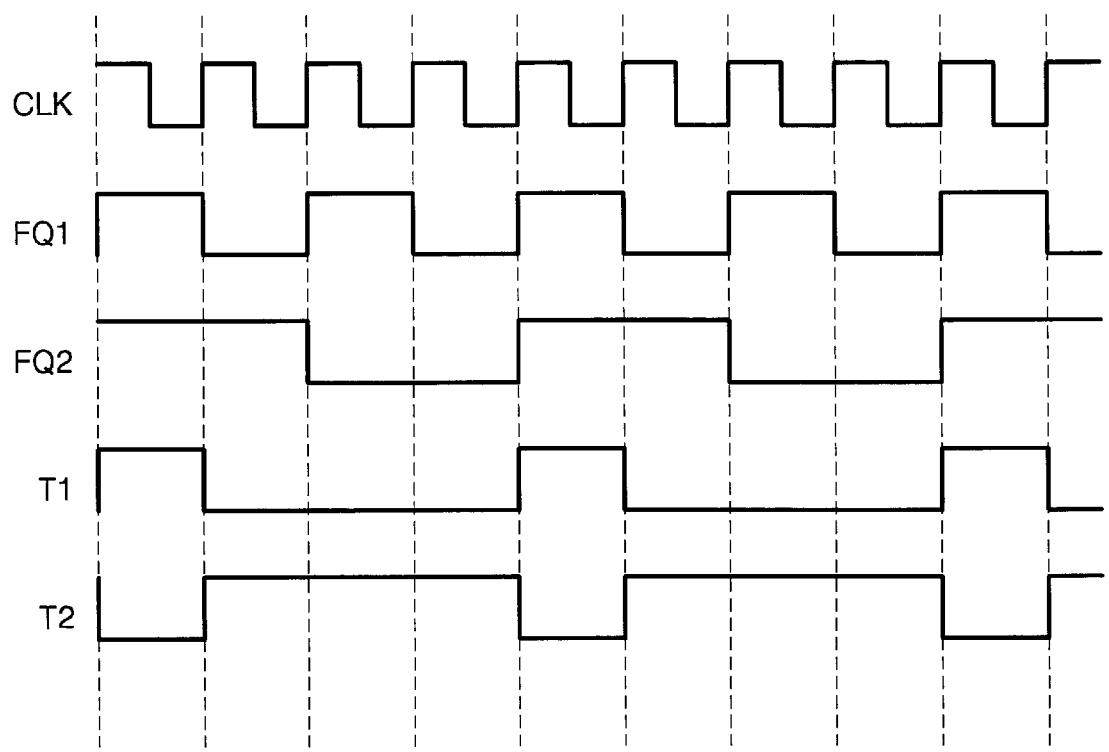
FIG. 4 is a graph showing a waveform for the clock generator and a timing control signal generating circuit in FIG. 2.

FIG. 3 is a concrete circuit diagram showing a clock generator of FIG. 2, and FIG. 4 is a graph showing a waveform for the clock generator and a timing control signal generating circuit in FIG. 2.

Referring to FIG. 3, the clock generator 110 includes an oscillating circuit 112 and D-flip flop (114, 116). The oscillating circuit 112 includes bipolar transistors (Q1~Q5), a capacitor (C1) and resistors (R1~R7), and generates a clock signal (CLK) of FIG. 4.

The oscillating circuit 112 generates a bias current through a resistor (R1) and transistors (Q1~Q5, Q14), and charges or discharges the capacitor (C1) by means of the charge-discharge circuit comprised of the capacitor (C1) and transistors (Q6~Q8). A waveform of a voltage signal applied between both ends of the capacitor (C1) is transformed into a pulse shape through a wave shaping circuit, for example a schmitt trigger circuit comprised of transistors (Q9~Q13) and resistors (R3~R6), and a signal of the pulse shape is outputted as a clock signal (CLK) through a resistor (R7) and transistor (Q15).

A D-flip flops (114, 116) receive the clock signal and each D-flip flop generates a two-dividend signal (a signal with ½ frequency of the clock frequency) (FQ1) and a four-dividend signal (a signal with ¼ frequency of the clock frequency) (FQ2) of FIG. 4, respectively.

The control signal generating circuit 120 includes a timing control signal generating circuit 122 and a mode control signal generating circuit 124.

Figure 5:
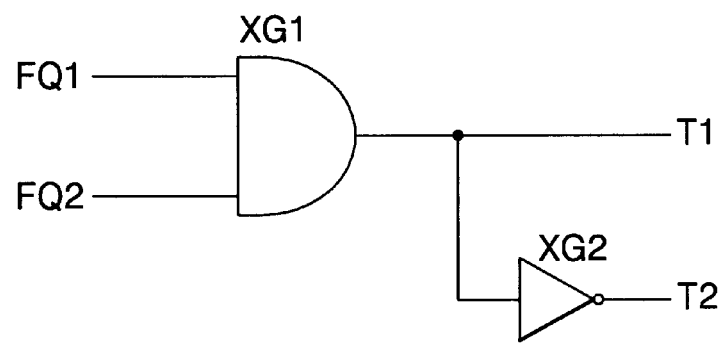
FIG. 5 is a circuit diagram showing a timing control signal generating circuit of FIG. 2.

FIG. 5 is a circuit diagram showing a timing control signal generating circuit of FIG. 2.

Referring to FIG. 5, the timing control signal generating circuit 122 receives the clock signal (CLK), two-dividend signal (FQ1) and four-dividend signal (FQ2), and generates a timing control signal (T1, T2) of FIG. 4. An AND gate (XG1) of the timing control signal generating circuit 122 receives the two-dividend signal (FQ1) and four-dividend signal (FQ2), and generates a first timing control signal (T1). The first timing control signal (T1) has an active interval of a high level for one clock period and a non-active interval of a low level for three clocks period. An inverter (XG2) inverts the first timing control signal (T1) into a second timing control signal (T2).

Figure 6:
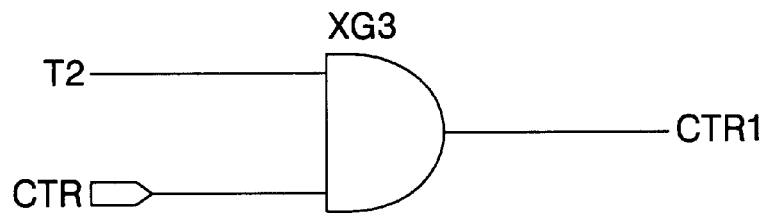
FIG. 6 is a circuit diagram showing a mode control signal generating circuit of FIG. 2.

FIG. 6 is a circuit diagram showing a mode control signal generating circuit of FIG. 2.

Referring to FIG. 6, the mode control signal generating circuit 124 includes an AND gate (XG3). The AND gate (XG3) receives an external control signal (CTR) and the T2 signal, and generates an internal control signal (CTR1)

Figure 7:
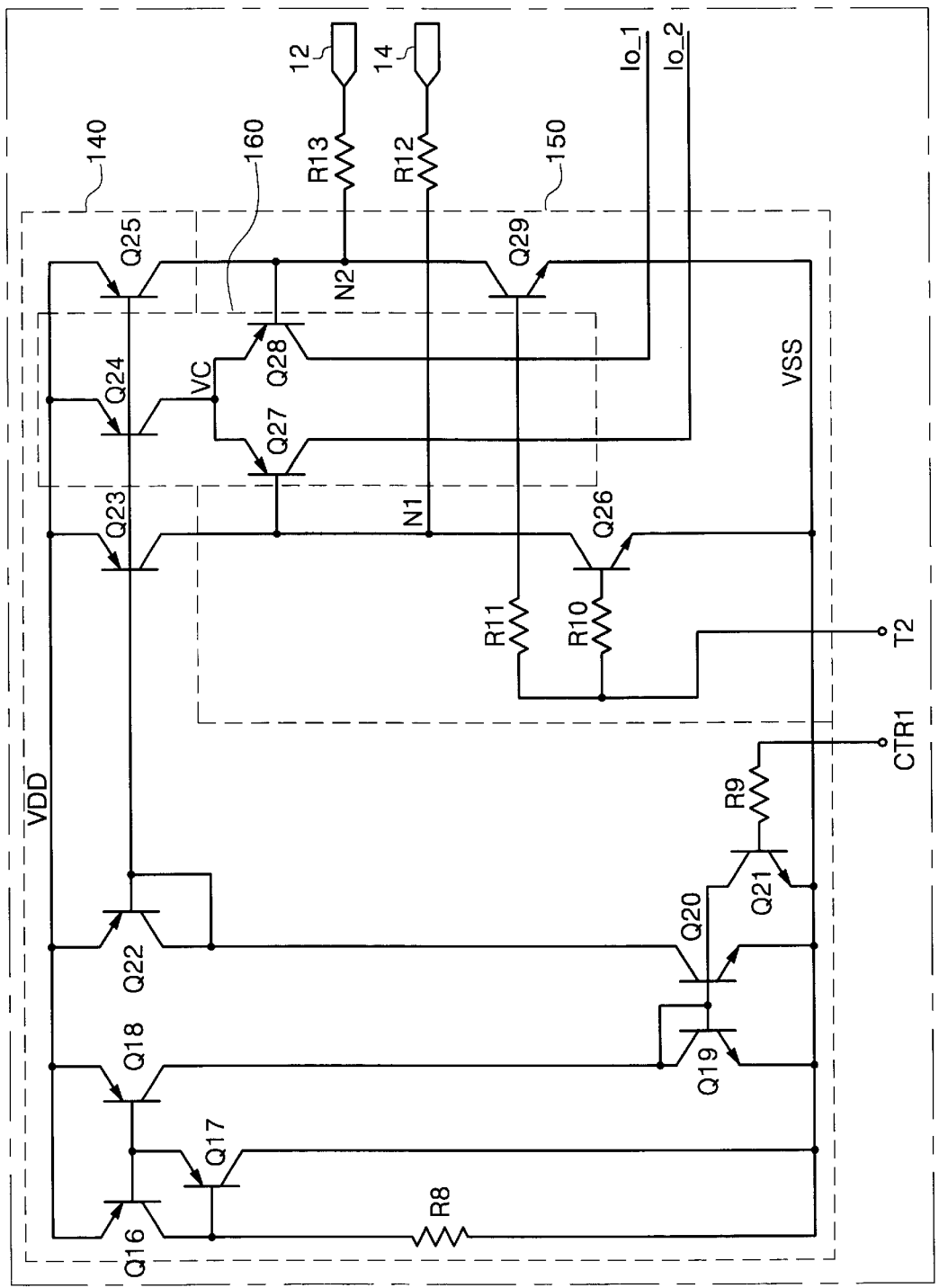
FIG. 7 is a concrete circuit diagram showing a current mirror circuit, differential amplification circuit and a discharge circuit of FIG. 2.

FIG. 7 is a concrete circuit diagram showing a current mirror circuit, differential amplification circuit and a discharge circuit of FIG. 2.

Referring to FIG. 7, the current mirror circuit 140 includes resistors (R8, R9) and transistors (Q16~Q25). The current mirror circuit 140 generates a reference current by means of R8, Q16, Q17 and Q18, and provides a same current to both a node N1 and node N2 by means of a first current mirror (Q19, Q20) and a second current mirror (Q22, Q23, Q25). The current mirror circuit 140 operates in response to the internal control signal (CTR1) inputted through R9 and Q21.

In case of a normal mode in which CTR is high level, the current mirror circuit 140 operates to provide currents during a low level interval of T2, the current mirror circuit 140 dose not operate and does not provide currents during a high level interval of T2. In case of the normal mode, the current mirror circuit 140 operates for only one clock period among four clocks period, and does not operate for the rest three clocks period to minimize power consumption.

However, in case of a high precision mode in which CTR is low level, the current mirror circuit 140 operates regardless of a state of T2.

The discharge circuit 150 includes resistors (R10~R13) and transistors (Q26, Q29). Q26 and Q29 maintain turn-off state in response to the T2 signal for one clock period in which the T2 signal has a low level, and provide the current supplied from the current mirror circuit 140 to the input terminals (12, 14). Q26 and Q29 maintain turn-on state for three clocks period in which the T2 signal has a high level, and discharge the charge in the nodes N1 and N2 to the ground. Resistors R12 and R13 has an appropriate resistance to prevent abrupt discharging current when discharge operation occurs.

The differential amplification circuit 160 includes transistors (Q24, Q27, Q28), compares a voltage difference between the node N1 and the node N2, outputs currents lo_1 and lo_2 to which the voltage difference are reflected.

Figure 8:
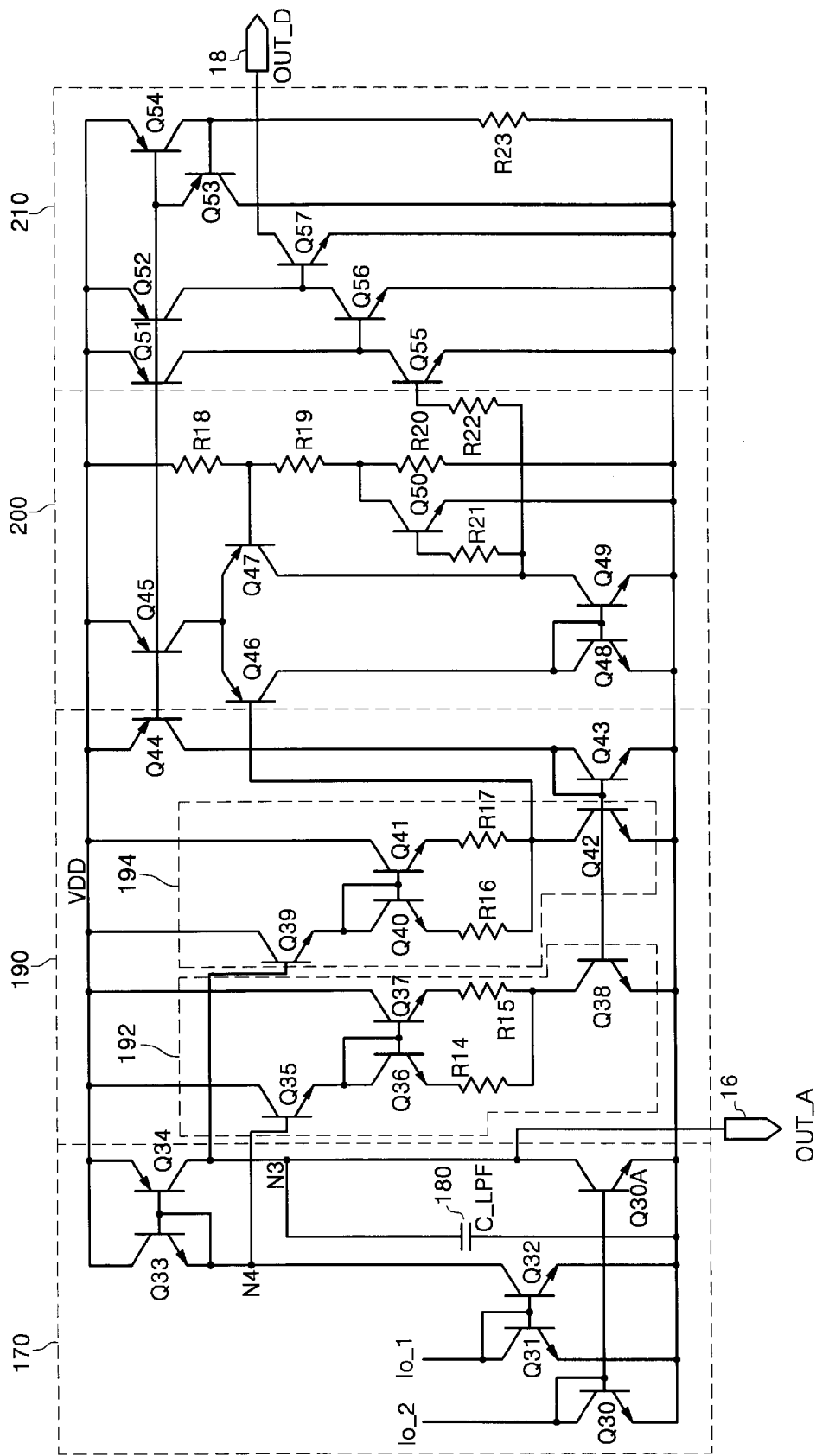
FIG. 8 is a concrete circuit diagram showing a first output circuit, a schmitt trigger circuit and a second output circuit of FIG. 2.

FIG. 8 is a concrete circuit diagram showing a first output circuit, a schmitt trigger circuit and a second output circuit of FIG. 2.

Referring to FIG. 8, the first output circuit 170 includes transistors (Q29~Q34).

A current mirror (Q29, Q30, Q30A) provides a node N3 with a current corresponding to the current lo_2, a current mirror (Q31, Q32) provides a node N4 with a current corresponding to the current lo_1. A current mirror (Q33, Q34) provides a current to nodes N3 and N4.

The integrating circuit 180 includes a capacitor (C_LPF) connected between the node N3 and the ground. Accordingly, a voltage corresponding to a difference between the lo_1 and lo_2 is charged in the capacitor (CLPF). The node N3 is connected to the first output terminal 16, and outputs an instantaneous anolog voltage signal that is charged in the capacitor (C_LPF).

The buffer circuit 190 includes transistors (Q35~Q44) and resistors (R14~R17). A first buffer 192 includes transistors (Q35~Q38) and resistors (R14~R15), and a second buffer 194 includes transistors (Q39~Q42) and resistors (R16~R17). The first buffer 192 and the second buffer forms an emitter follow having high impedance. Preferably, the capacitor (CLPF) is designed to have small capacitance so as to reduce a chip area occupied by the capacitor (C_LPF). However, when a capacitor (C_LPF) of small capacitance is used, it is possible that the voltage of the capacitor (C_LPF) varies due to a loading of the buffer because small charges are charged in the capacitor (C_LPF).

The first buffer 192 is a dummy buffer for buffering the node N4 so as to compensate the signal loss in the node N3 when signals are buffering by the second buffer 194. Accordingly, sensing error due to the buffering is minimized.

The schmitt trigger circuit 200 includes transistors (Q45~Q50) and resistors (R18~R22). The schmitt trigger circuit 200 transforms a sensed signal buffered by the second buffer 194 to a digital signal based on a high reference signal of resistors (R18, R19, R20) and a low reference signal of resistors (R18, R19).

The second output circuit 210 includes transistors (Q51~Q57) and resistors (R23). The transistors (Q51~Q54) and resistors (R23) provide a bias current. A cascade connected inverter includes Q55 and Q56, and Q57 with an open collector is connected to the second output terminal 18. A signal from the second output terminal is a digital sensed signal that reflects a change of impedance of an input device in a microcomputer or microprocessor, and the digital sensed signal is provided to the microcomputer or microprocessor.

An external capacitor can be connected to the first output terminal 16 so as to prevent the chattering of the digital signal output to the second output terminal 18. Hereinafter, an operation of one exemplary embodiment of the present invention is described.

The current mirror circuit 140 provides current to the input terminals (12, 14) through, respectively, parasitic impedance Zs1 and Zs2. Each parasitic impedance Zs1 and Zs2 is designed to have a same impedance.

Each input terminal of the two input terminals of a chip is arranged to be a mirror input terminal so that a pad capacitance of each input terminal is the same and a length of wiring of each input terminal is the same. Also, each input terminal uses a same bonding of a chip, and each input terminal uses a same bonding of a lead. Accordingly, a parasitic capacitance of each input terminal is the same to each other, a parasitic resistance of each input terminal is the same to each other, and a parasitic inductance of each input terminal is the same to each other.

Also, each input terminal uses a printed circuit board with a same wiring so as to have same impedance between a measurement point and a reference impedance point. The current mirror circuit 140 provides same current (Is) to each reference impedance (Z_ref) and measurement impedance (Z_test). The reference impedance (Z_ref) and measurement impedance (Z_test) are connected to each of the input terminals (12, 14) through lines with same condition. Accordingly, input impedance of each nodes (N1, N2) is expressed as the following.

$$Zin1=Zref+Zs1 \qquad \text{Expression 2}$$

$$Zin2=Ztest+Zs2 \qquad \text{Expression 3}$$

Figure 9:
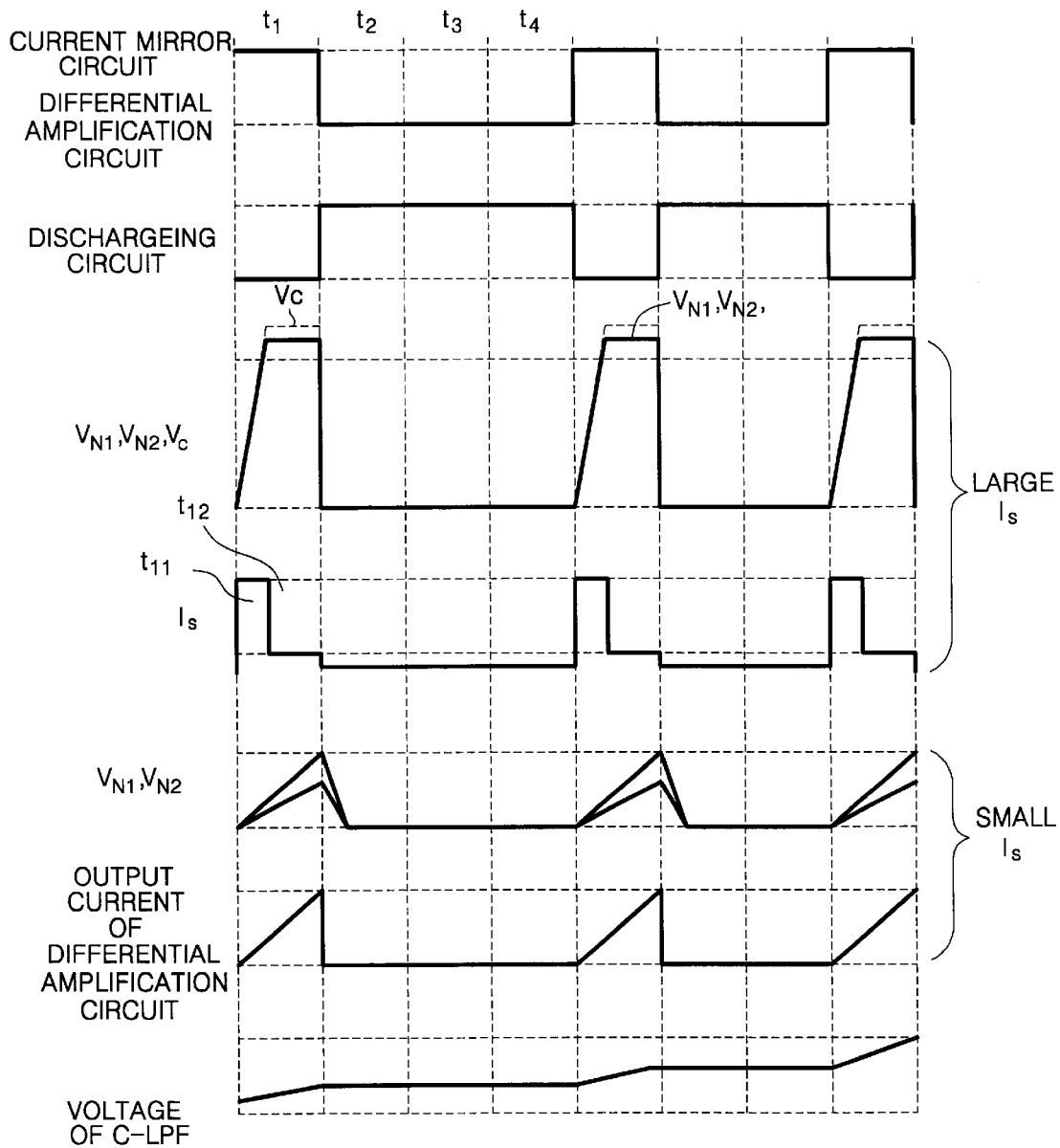
FIG. 9 is a timing chart illustrating an operation of the impedance comparison integrated circuit of FIG. 2.

The current mirror circuit 140 maintains turn-on state, as shown in FIG. 9, during t1 clock period of T2 generated from the control signal generating circuit 120, and maintains turn-off state during t2~t4 clocks period. Also, the discharge circuit 150 maintains turn-on state during t2~t4 clocks period of T2, and maintains turn-off during t1 clock period.

The differential amplification circuit 160 maintains turn-on state, and maintains turn-off state to have no input current during t2~t4 clocks period. Specifically, The current 'Is' charges the parasitic impedances (Zs1, Zs2) and the external impedances (Z_ref, Z_test) during t1 clock period, and current charged in the input impedance is discharged during t2~t4 clocks period.

Also, the current mirror circuit 140 and the differential amplification circuit 160 maintains turn-off state to reduce consumption of power during t2~t4 clocks period, so that an output current of the differential amplification circuit 160 does not flow into the differential amplification circuit 160 during t2~t4 clocks period.

An input voltage is generated in the differential amplification circuit 160 by current input into the input impedance during t1 clock period. The input voltage has a voltage difference proportional to the difference between Zin1 and Zin2, and is amplified to generate the output current of the differential amplification circuit 160.

The Zs1 and Zs2 have the same impedance, and Zin1 is equal to (Zref+Zs1) and Zin2 is equal to (Ztest+Zs2), so that the Zs1 and Zs2 do not cause the input voltage difference because.

The input impedance can be expressed by means of capacitive impedance as the following.

$$Vin=1/C \times Is\ dt \qquad \text{Expression 4}$$

$$Vin=Is \times t1 \times 1/C \qquad \text{Expression 5}$$

$$C=Cin+Cs \qquad \text{Expression 6}$$

The 'Cs' influences an incremental gradient of the 'Vin', but does not influence inversion of the differential value because the 'Vin' of the differential amplification circuit 160 is equal to (Vin1−Vin2).

An impedance difference error due to the parasitic capacitance is not generated because 't1' has a period long enough to prevent occurrence of an effect of the parasitic impedance.

The differential amplification circuit 160 receives the input voltage, and outputs the output current of the differential amplification circuit 160. The output current (Io) is proportional to the difference between Zin1 and Zin2.

$$Io=Gm+Vin\ (Gm\text{:transconductance of the differential amplification circuit 160}) \qquad \text{Expression 7}$$

The output current (Io) is sensed by an analogue output voltage signal (Vo) through an external resistor Ro nected to the first output terminal 16.

$$Vo\_A=Io \times Ro \qquad \text{Expression 8}$$

Also, the output current (Io) is integrated by the capacitor (C_LPF) for a plurality of t1 periods, and is sensed by an digital output voltage (Vo_D) through a buffer (192, 194) with high impedance, the schmitt trigger circuit 200 and the second output circuit 210. The digital output voltage (Vo_D) is output through an open drain (or open collector), so that each digital output voltage of a plurality of the impedance comparison integrated circuits according to the present invention is easily transformed to an analogue output signal by using a resistor ladder. DC output voltage of the resistor ladder is applied to an input terminal of the microcomputer, so that the number of input terminals of the microcomputer can be minimized.

Also, the current mirror circuit 140 and differential amplification circuit 160 is turned on during t1 period by the second timing control T2, so that current consumption can be minimized to be not greater than about 70 μm. While the differential amplification circuit 160 is turned off, current does not flow through the differential amplification circuit 160, so that the integrating circuit 180 holds a value of the integrating circuit 180 when the t1 period ends.

Current is provided to the capacitor (C_LPF) of the integrating circuit 180 only during t1 period, the capacitance of the capacitor (C_LPF) is reduced by t1/(t1+t2+t3+t4), so that a chip area occupied by the capacitor (C_LPF) can be minimized in a chip design.

The analogue output voltage signal (Vo_A) has a peak voltage corresponding to a maximum voltage of the input voltage (Vin), which is applied between the two input terminals (12, 14) of the differential amplification circuit 160 during t1 period and reflects the difference between two input terminals (12, 14) by repeating the above mentioned procedure periodically. When large current 'Is', compared with the input impedance, is provided and charged voltages ($V_{N1}$, $V_{N2}$) increase to an applied voltage (Vc), the current mirror circuit 140 operates at a saturation region of transistor for a early 't11' period of 't1' period, so that the current mirror circuit 140 stops to supply current.

As shown in FIG. 9, the power consumption is normal only during 't11' period, and is very low during 't12' period. Also, the differential amplification circuit 160 reaches about turn-off state because the input voltage of the differential amplification circuit 160 is about the applied voltage (Vc), so that the power consumption of the current mirror circuit 140 and the differential amplification circuit 160 is small enough to be disregarded. Accordingly, the power consumption of the impedance comparison integrated circuit 100 can be minimized.

Also, when external resistor Ro is increased infinitely, the output of the integrating circuit 180 reaches a threshold voltage of the shmitt trigger circuit 200 according as the clock signal (CLK) repeats periodically. Then, the output voltage Vo_D of the second output terminal 18 is changed into a high or low level according to the size of the Zin1 and Zin2.

The error of the differential amplification circuit 160 includes a $V_{discharge}$ error due to a discharging voltage $V_{discharge}$ and an input offset error of the differential amplification circuit 160. The $V_{discharge}$ error is due to the $V_{discharge}$ generated through the Zin1 and Zin2 during t2~t4. The error of the differential amplification circuit 160 is reduced greatly compared with the conventional error.

The discharge operation begins through the input impedance during t2~t4, no error is generated when the discharge operation begins because the differential amplification circuit 160 is in a turn-off state before the discharge operation begins. When the discharge operation is completed and charging operation begins, an charging delay error, which is generated because the beginning of charging operation is delayed, may be disregarded due to starting delay of charging operation because one clock sends the same charging starting signals.

Accordingly, the error, $V_{offset\_error}$, of the impedance comparison integrated circuit 100 is expressed as below.

$$V_{out\_error} = V_{discharge\_error} + V_{offset\_error}$$

Embodiment 2

Figure 10:
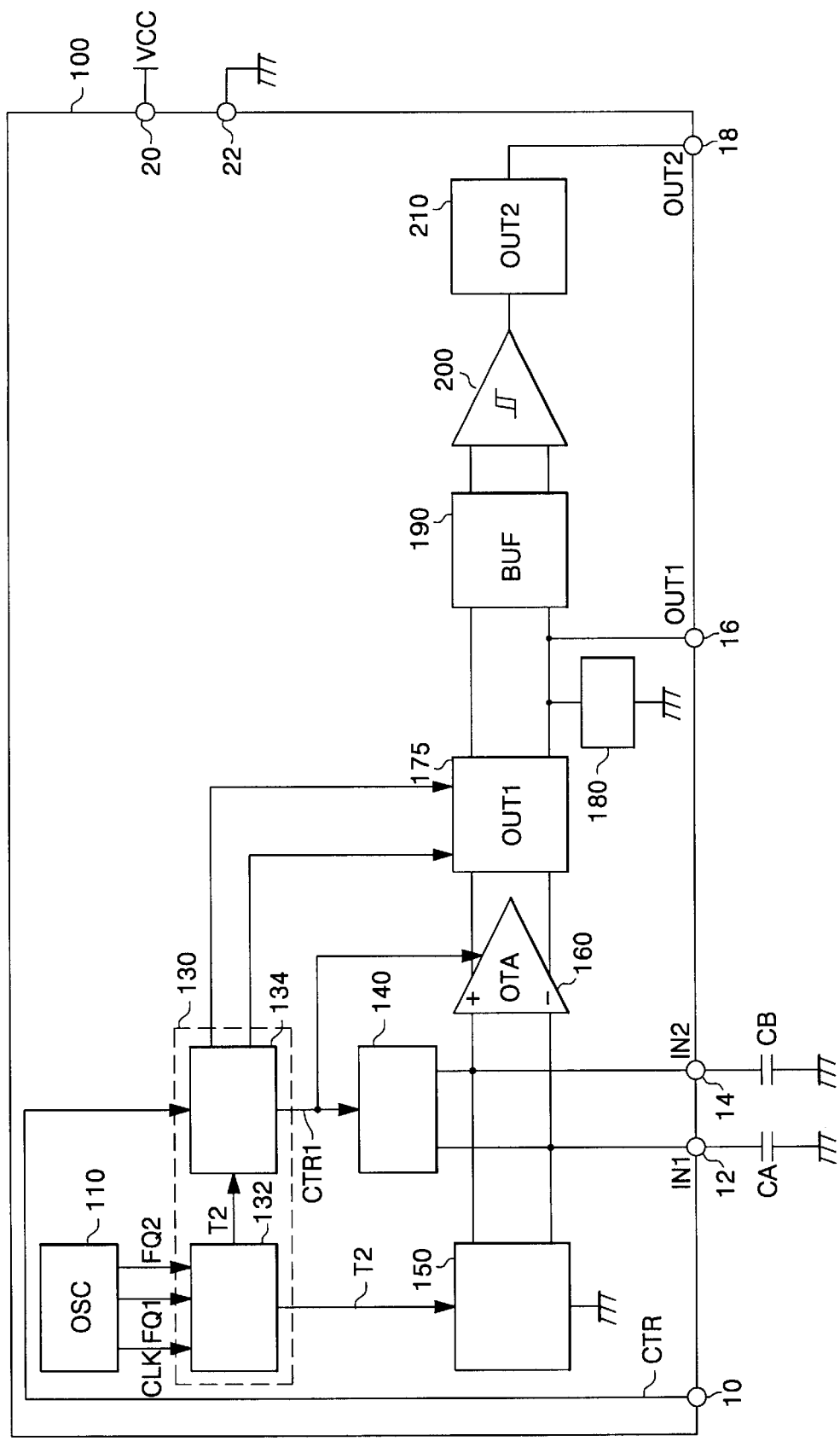
FIG. 10 is a circuit diagram showing an impedance comparison integrated circuit according to another exemplary embodiment of the present invention.

FIG. 10 is a circuit diagram showing an impedance comparison integrated circuit according to another exemplary embodiment of the present invention.

Referring to FIG. 10, the impedance comparison integrated circuit 100 according to another embodiment of the present invention has the same circuits as that according to one embodiment of the present invention except a control signal generating circuit 130 and a first output circuit 175. The same reference numerals are used for the same circuit, and explanation is omitted.

The control signal generating circuit 130 includes a timing control signal generating circuit 132 and a mode control signal generating circuit 134.

Figure 11:
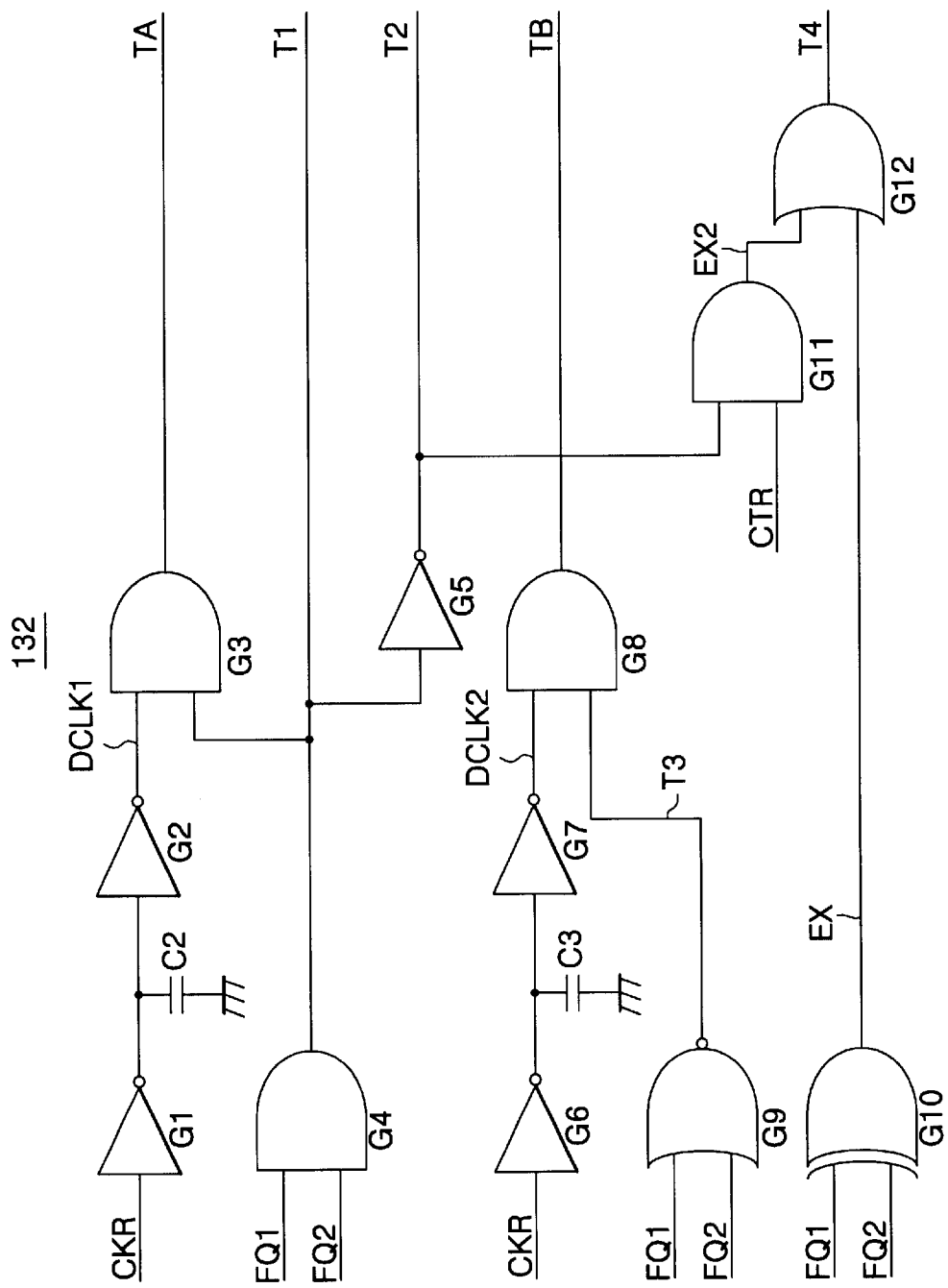
FIG. 11 is a circuit diagram showing a timing control signal generating circuit of FIG. 10.
Figure 12:
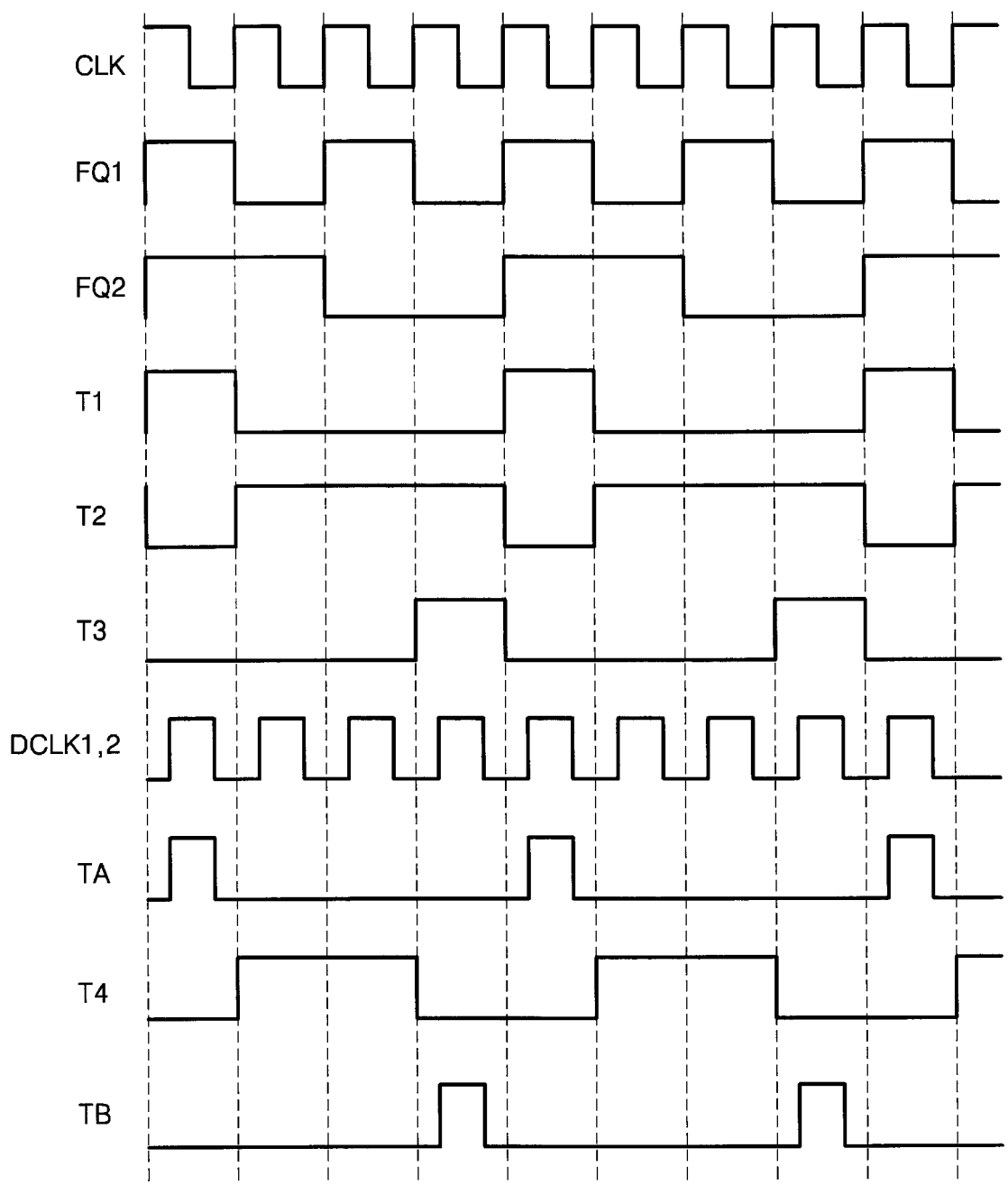
FIG. 12 is a graph showing a waveform for the timing control signal generating circuit of FIG. 11.

FIG. 11 is a circuit diagram showing a timing control signal generating circuit of FIG. 10, and FIG. 12 is a graph showing a waveform for the timing control signal generating circuit of FIG. 11.

Referring to FIG. 11, the timing control signal generating circuit 132 receives the clock signal (CLK), two-dividend signal (FQ1) and four-dividend signal (FQ2), and generates a timing control signal (T1, T2, T3, T4, TA, TB) of FIG. 12.

The timing control signal generating circuit 132 generates a delayed clock signal (DCLK1) through a first delay circuit comprised of inverters (G1, G2) and capacitor (C2). An AND gate (G4) of the timing control signal generating circuit 132 receives the two-dividend signal (FQ1) and four-dividend signal (FQ2), and performs an AND operation on the FQ1 and FQ2 signals to generate a first timing control signal (T1). The first timing control signal (T1) has an active interval of a high level for one clock period and a non-active interval of a low level for three clocks period. An inverter (G5) inverts the first timing control signal (T1) into a second timing control signal (T2). An AND gate (G3) receives DCLK1 and T1 signals, and performs an AND operation on the DCLK1 and T1 signals to output a timing control signal (TA) at every 4-clock period that has the same duty ratio as that of the clock signal (CLK).

The timing control signal generating circuit 132 generates a delayed clock signal (DCLK2) through a second delay circuit comprised of inverters (G6, G7) and capacitor (C3). An NOR gate (G9) of the timing control signal generating circuit 132 receives the two-dividend signal (FQ1) and four-dividend signal (FQ2), and performs an NOR operation on the FQ1 and FQ2 signals to output a third timing control signal (T3). The third timing control signal (T1) is a phase-delayed signal by 3 clock periods compared with the T1 signal. An AND gate (G8) receives DCKL3 and T3 signals, and performs an AND operation on the DCKL3 and T3 signals to output a timing control signal (TB) that has a high level for one clock period at every 4-clock period. The TB signal is a phase-delayed signal by 3 clock periods compared with the TA signal.

The XOR gate (G10) receives FQ1 and FQ2 signals, and performs an exclusive OR operation on the FQ1 and FQ2 signals to output an EX signal. The AND gate (G11) performs an AND operation on the T2 signal in response to the control signal (CTR). Accordingly, T2 signal is output in case of the normal mode and a low level signal is output in case of the high precision mode. The OR gate (G12) outputs selectively an output signal (EX2) of G11 gate or the EX signal. Accordingly, T4 signal is the T2 signal in case of the normal mode, and is the EX signal in case of the high precision mode.

Figure 13:
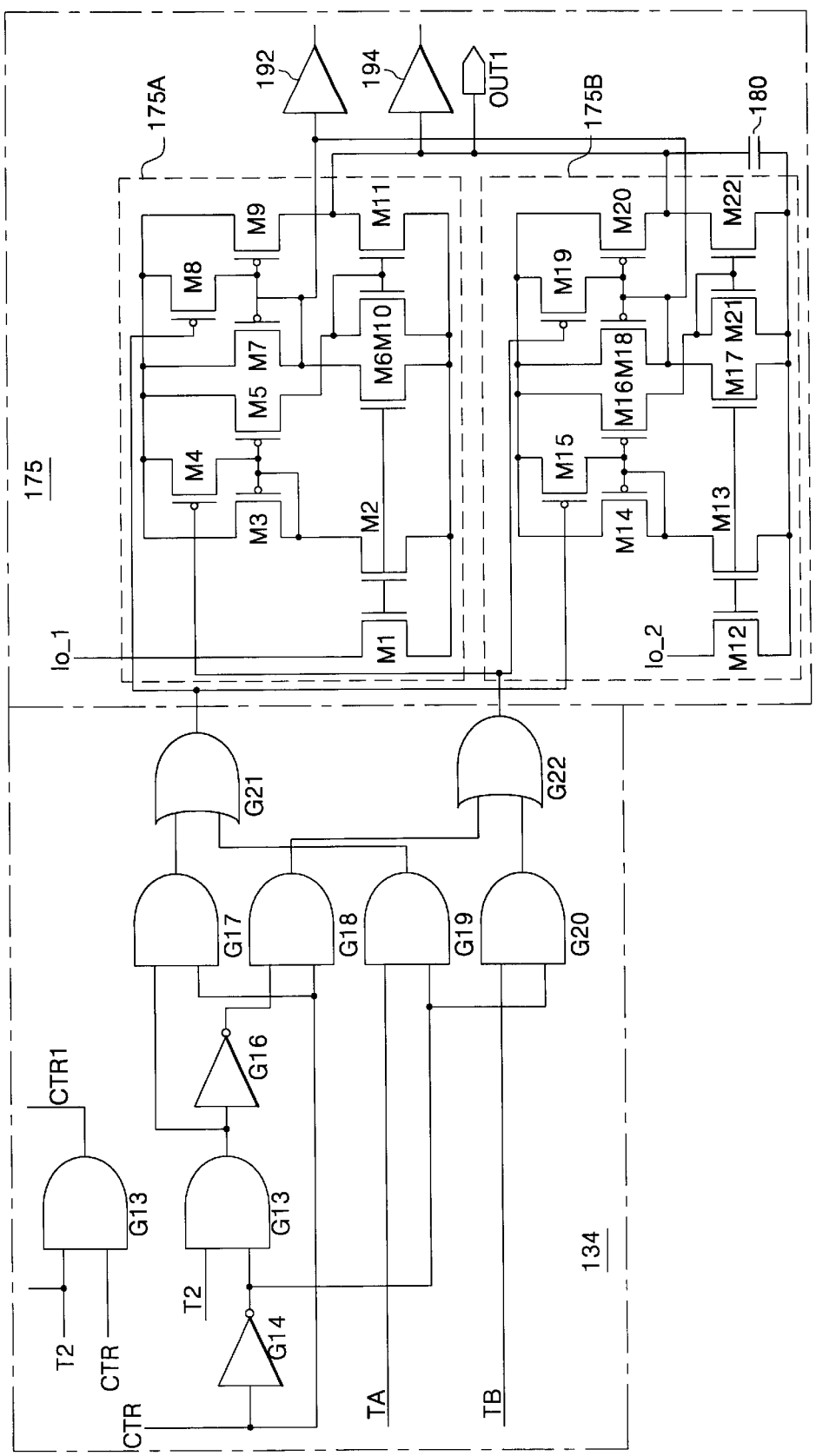
FIG. 13 is a circuit diagram showing a mode control signal generating circuit and a first output circuit of FIG. 10.

FIG. 13 is a circuit diagram showing a mode control signal generating circuit and a first output circuit of FIG. 10.

Referring to FIG. 13, the mode control signal generating circuit 134 includes gates (G13~G22). The external control signal maintains a high level in the normal mode, and maintains a low level in the high precision mode.

The AND gate (G13) outputs the T2 signal as an internal control signal (CTR1) in the normal mode, and the CTR1 signal maintains a low level in the high precision mode.

Accordingly, the current mirror circuit 140 and the differential amplification circuit 160 is turned on during a T2 period, and maintains turn-off states during the T2~T4 periods. However, the differential amplification circuit 160 maintains always turn-on state.

The discharge circuit 150 discharges during T2~T4 periods because the T4 signal is provided as the T2 signal in the normal mode, and discharges only during T2 and T3 periods because the T4 signal is provided as the EX signal.

Gates G19 and G20, respectively, receive a low level signal at their input port in the normal mode because the CTR signal is in the high level, so that the TA and TB signals are not output through the gates G19 and G20 in the normal mode. Also, the T2 signal is not output through a gate G15. An output of a gate G15 is maintained at a low level, so that an output of a gate G17 has a low level and an output of a gate G18 has a high level.

Accordingly, an output of a gate G21 maintains a low level state and an output of a gate G22 maintains a high level state.

Outputs of Gates G17 and G18, respectively, has a low level in the high precision mode because the CTR signal is in the low level, and TA and TB signals are output through the gates G19 and G20 in the high precision mode.

The first output circuit 175 includes a first driver circuit 175A and a second driver circuit 175B.

The first driver circuit 175A includes transistors (M11~M11), and the second driver circuit 175B includes transistors (M12~M22).

In the normal mode, the first mode control signal maintains a low level, the second mode control signal maintains a high level, and the M4 of the first driver circuit 175A is turned off, so that the M3, M5, M10 and M11 maintains turn-on state. Also, in the normal mode, the M8 maintains turn-off state, the M3, M5, M10 and M11 maintains turn-on state, M8 maintains turn-on state, and the M7 and M9 is turned off, so that the first driver circuit 175A provides pull down current that discharges the capacitor C-LPF in response to the second current Io_2.

In the normal mode, the M19 of the second driver circuit 175B is turned off, the M18 and M20 maintains turn-on state, the M15 maintains turn-on state, the M14 and M16 is turned off, so that the second driver circuit 175B provides pull up current that charges the capacitor C-LPF in response to the first current lo_1.

Accordingly, in the normal mode, the capacitor C-LPF is discharged for one clock period, the charged voltage of the capacitor C-LPF is held for three clock periods, and repeats the charging and holding operations for the next clock period.

Figure 14:
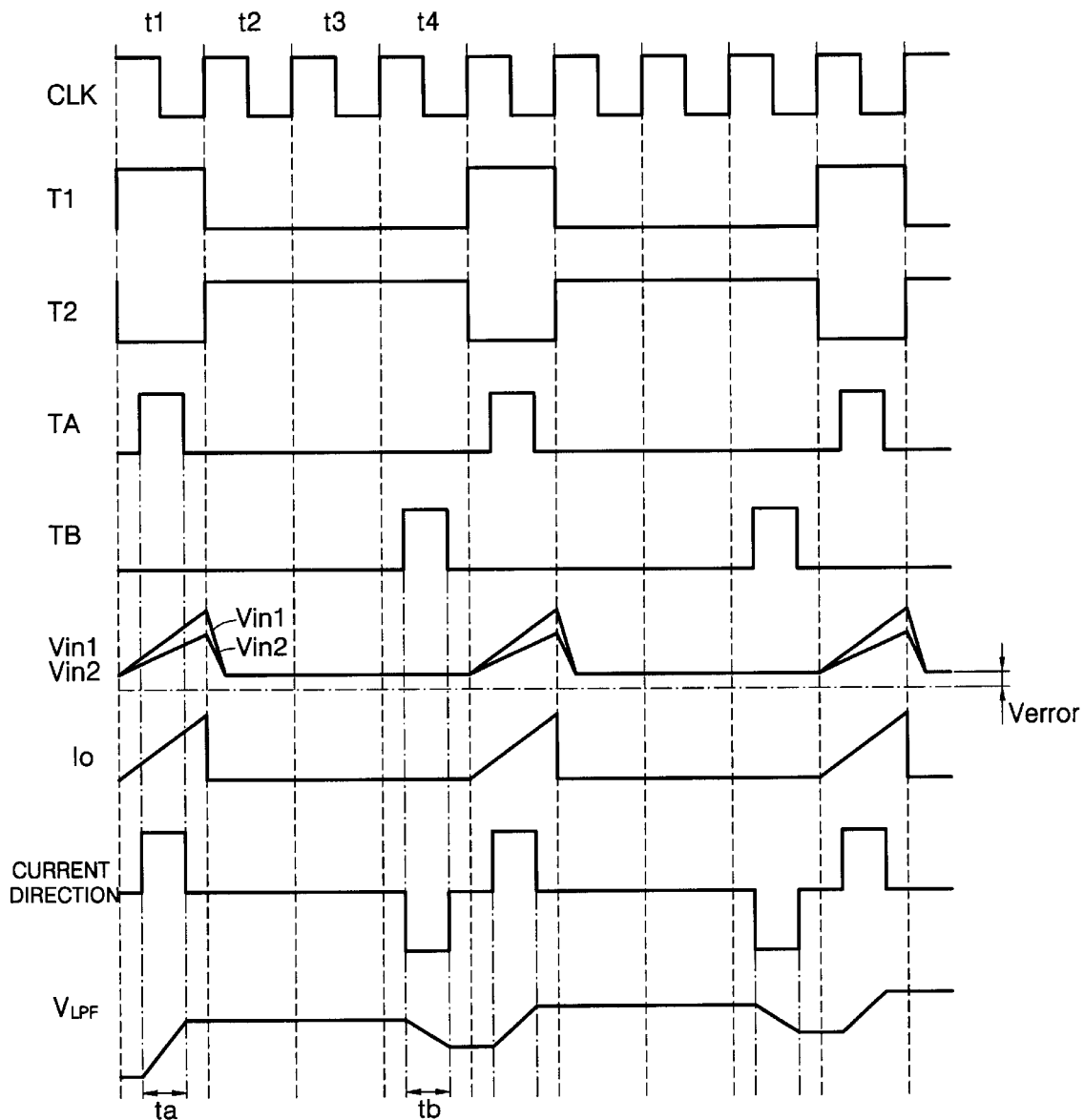
FIG. 14 is a timing chart illustrating an operation of the impedance comparison integrated circuit of FIG. 10.

FIG. 14 is a timing chart illustrating an operation of the impedance comparison integrated circuit of FIG. 10.

Referring to FIG. 14, in the high precision mode, the TA signal is provided as a first mode control signal, and the TB signal is provided as a second mode control signal.

The M8 and M15 is turned off while the TA signal is in a high level, and the M4 and M19 maintains a turn-on state, so that the M7, M9, M14 and M16 are turned on. Accordingly, the first driver circuit 175A provides pull up current, which charges the capacitor C-LPF in response to the second current lo_2, through the M1, M6, M7 and M9. Also, the second driver circuit 175B provides pull up current, which charges the capacitor C-LPF in response to the second current lo_1, through the M11, M13, M14, M16, M21 and M22. Accordingly, the capacitor C-LPF is charged by a current difference between the pull current and the pull down current.

While the TA and TB signals have both low level, the M4, M8, M15 and M19 are turned on, and the outputs of the first and second driver circuit is maintained as a high level state, so that the voltage of the capacitor C-LPF is maintained as the last voltage state of the charging period.

While the TB signal has a high level, the M4 and M19 are turned off, and the M8 and M15 maintains turn-on state, so that the M3, M5, M18 and M20 is turned on. Accordingly, compared with the current path formed by the TA signal with a high level, a current path is formed in an opposite direction when the TB signal has a high level. In other words, the first driver circuit 175A provides pull down current, which discharges the capacitor C-LPF in response to the second current lo_2, through the M1, M2, M3, M5, M10 and M11. Also, the second driver circuit 175B provides pull up current, which charges the capacitor C-LPF in response to the second current lo_1, through the M12, M17, M18 and M20. The first and second currents (lo_1, lo_2) has only the input offset error of the differential amplification circuit 160 and the $V_{discharge}$ error due to the discharging voltage $V_{discharge}$ when input signals through the first and second input terminal (12, 14) are excluded, and only the error signal charged on the capacitor (C-LPF) is discharged through the opposite current path, so that only the input signals are remained. Accordingly, impedance sensing with high precision is possible since error signals are removed from the input signals and only the input signals are sensed.

In addition, in the high precision mode, the charging and discharging periods is set to be Ta and Tb, respectively, shorter than t1 period, so that the inflow of the error signals is minimized at the rising edge and falling edge in on/off operations. This has the purpose of removing the errors of integrated current due to the delay of the discharging periods of the t2 and t3 since the differential amplification circuit 160 is in a turn-on state during the charging and discharging period.

The integrating circuits according to the embodiments of the present invention can be designed by means of bipolar transistors or MOS transistors. Preferably, the buffer circuit is designed by means of MOS transistor since the buffer circuit can be designed by using only one MOS transistor to have more simple circuit configuration compared with the buffer circuit designed by using bipolar transistors.

Figure 15:
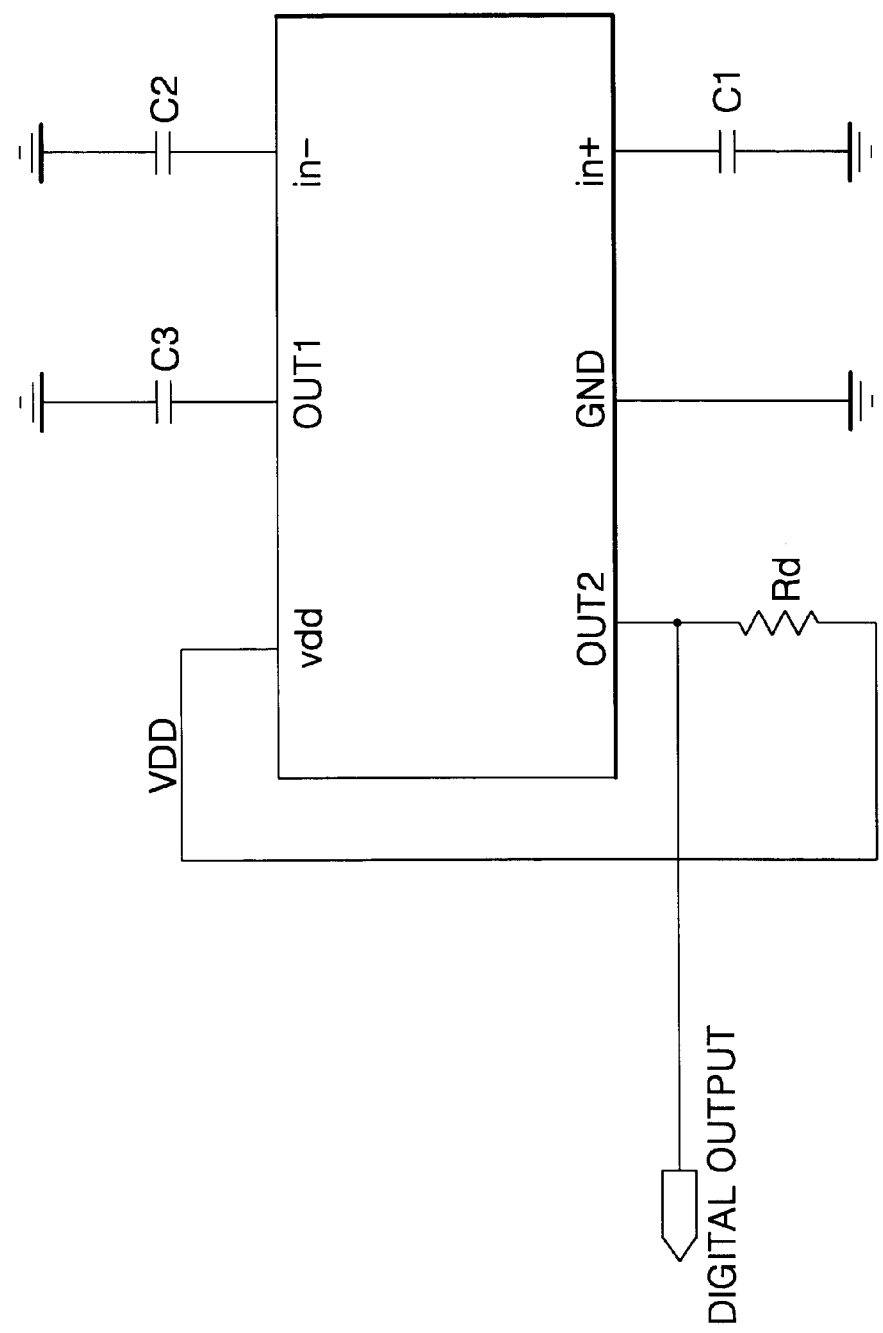
FIG. 15 is a circuit diagram showing a circuit for preventing chattering of digital output signal when comparing capacitive impedance.

FIG. 15 is a circuit diagram showing a circuit for preventing chattering of digital output signal when comparing capacitive impedance.

Referring to FIG. 15, an capacitor (C1) is connected to an input terminal (in+), and an capacitor (C2) is connected to an input terminal (in−). A capacitor (C3) for preventing chattering is connected to an output terminal (OUT1), and an external power voltage (VDD) terminal is connected through a pull up resistor Rd to an output terminal (OUT2).

Figure 16:
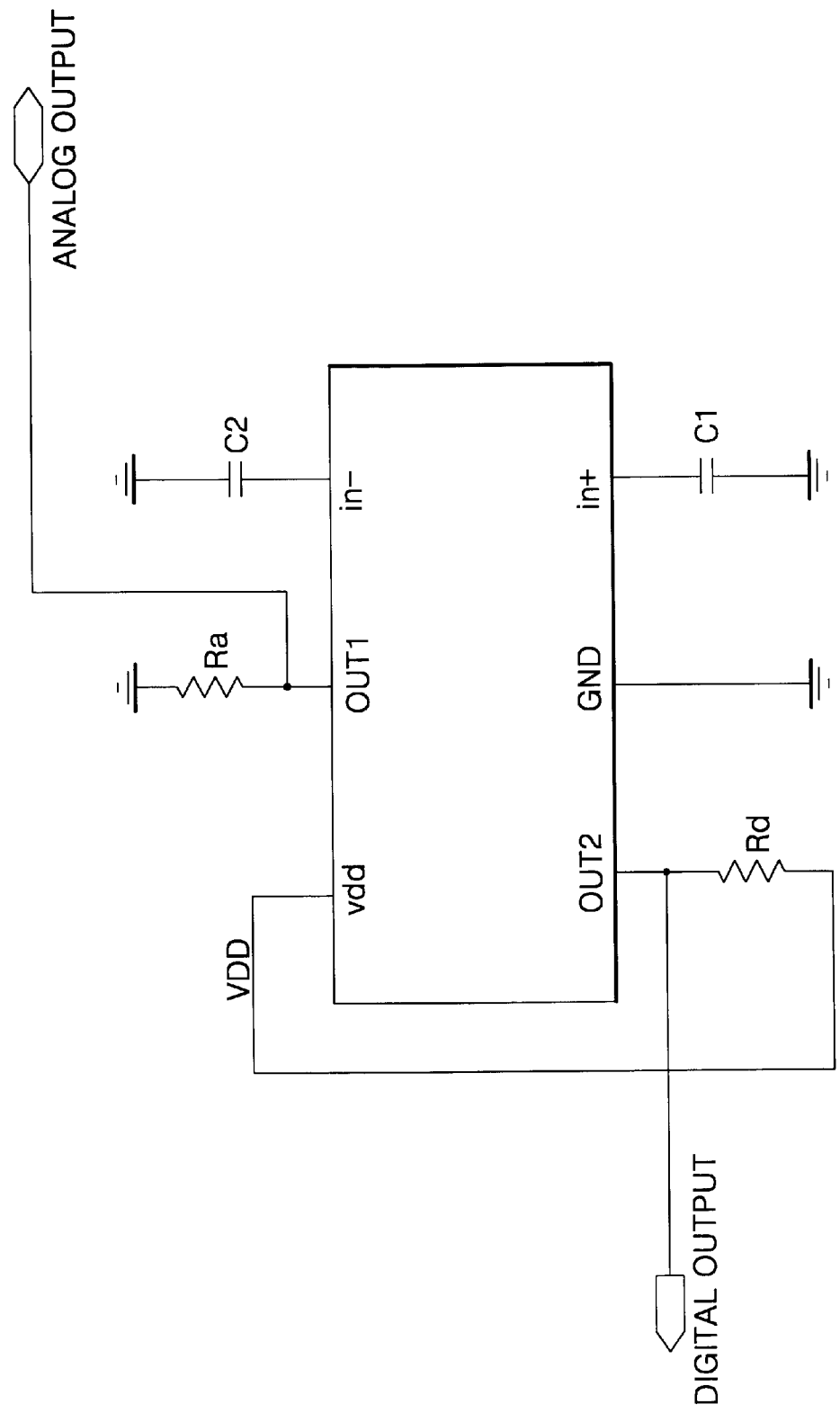
FIG. 16 is a circuit diagram showing a circuit for outputting analog instantaneous signal when comparing capacitive impedance.

FIG. 16 is a circuit diagram showing a circuit for outputting analog instantaneous signal when comparing capacitive impedance.

Referring to FIG. 16, compared with FIG. 15, a pull down resistor Ra, instead of the capacitor (C3), is connected to the output terminal (OUT1) to output an analog out signal.

Figure 17:
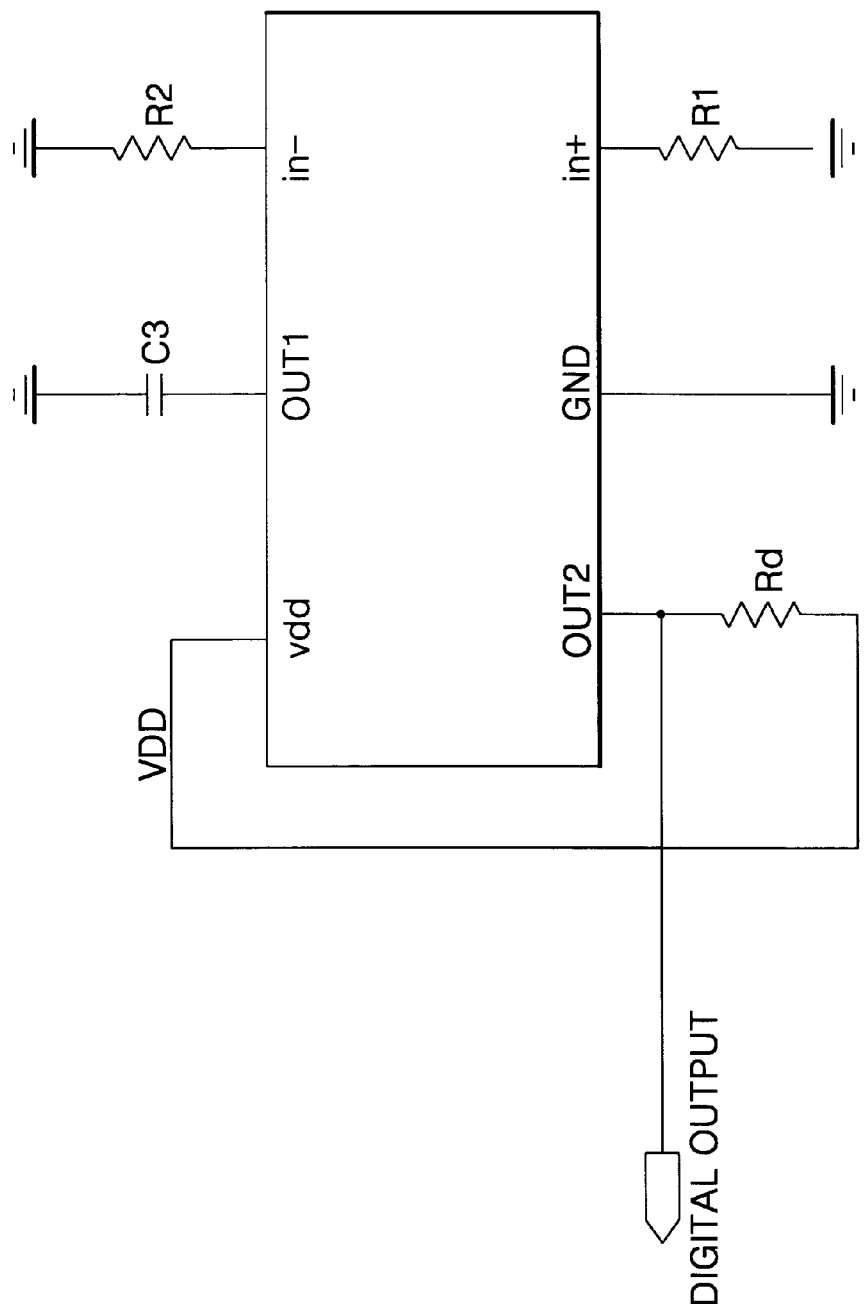
FIG. 17 is a circuit diagram showing a circuit for preventing chattering of digital output signal when comparing resistive impedance.

FIG. 17 is a circuit diagram showing a circuit for preventing chattering of digital output signal when comparing resistive impedance.

Referring to FIG. 17, compared with FIG. 15, resistor R1 and R2, instead of the capacitor C1 and C2, are connected to the input terminals in+ and in−, respectively.

Figure 18:
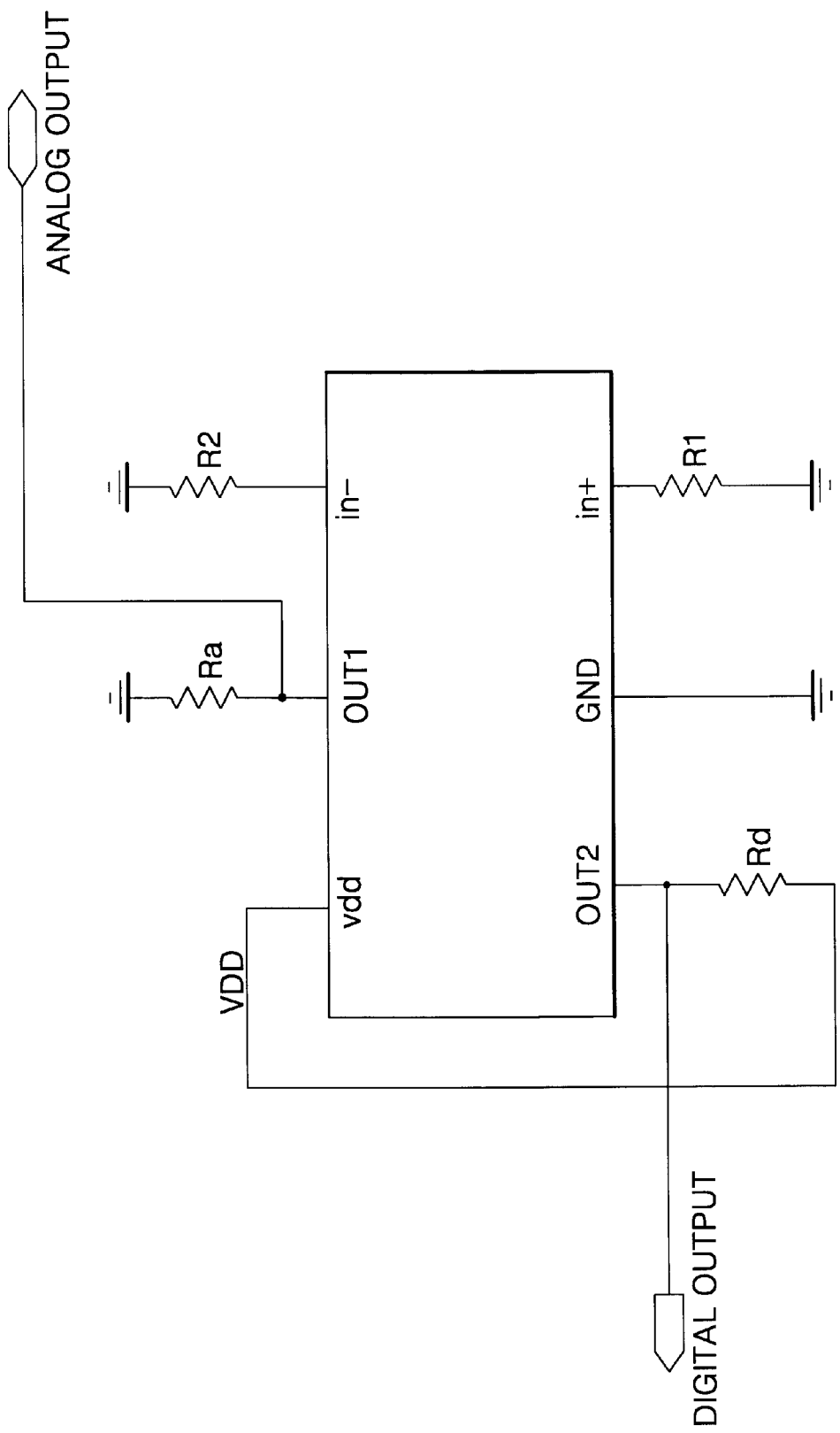
FIG. 18 is a circuit diagram showing a circuit for outputting analog instantaneous signal when comparing resistive impedance.

FIG. 18 is a circuit diagram showing a circuit for outputting analog instantaneous signal when comparing resistive impedance.

Referring to FIG. 18, compared with FIG. 16, resistor R1 and R2, instead of the capacitor C1 and C2, are connected to the input terminals in+ and in−, respectively.

Figure 19:
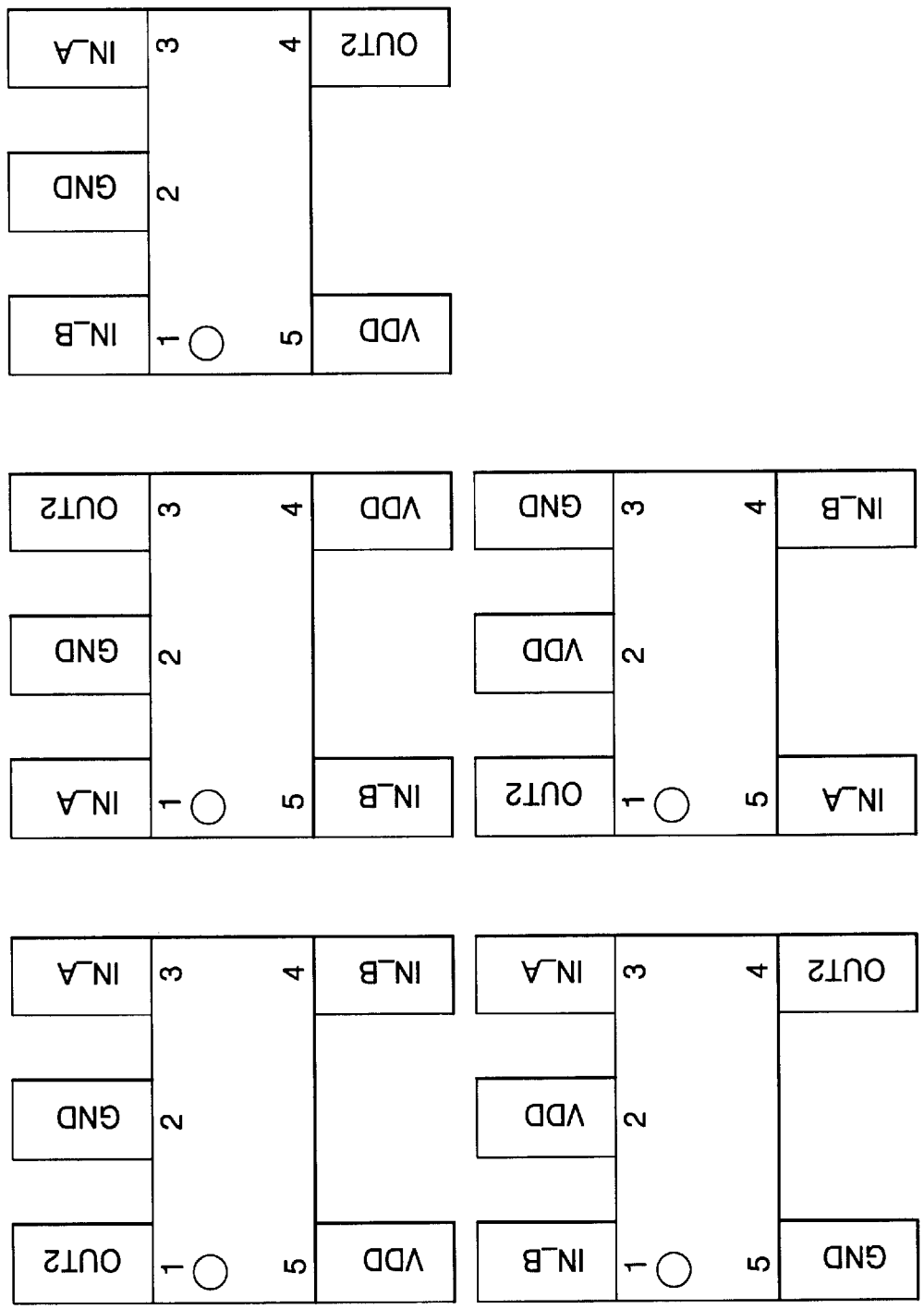
FIG. 19 is a block diagram showing various combinations of pin arrangement when an impedance comparison integrated circuit having 5 pins is mounted in a package.

FIG. 19 is a block diagram showing various combinations of pin arrangement when an impedance comparison integrated circuit having 5 pins is mounted in a package. The first output terminal 16 and the input terminal 10 are not connected to an external pin to be in a floating state. The first input (IN_A) pin and the second input (IN_B) pin are disposed to be symmetric each other with respect to a VDD pin or a GND pin, disposed to be symmetric each other at edge portions of the package, or disposed apart each other at edge portions of the package. These configurations of the input pins (IN_A, IN_B) minimize the parasitic capacitance of the input pins (IN_A, IN_B) or minimize the input errors by providing the same condition, so that exact sensing is made.

Figure 20:
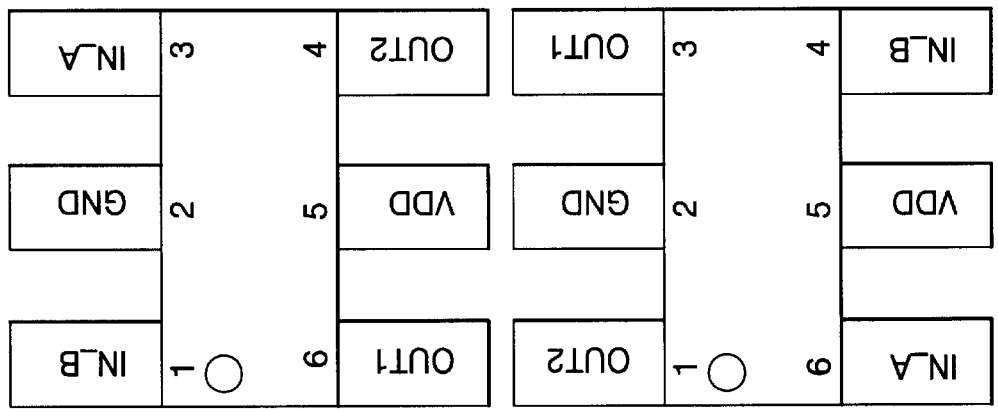
FIG. 20 is a block diagram showing various combinations of pin arrangement when an impedance comparison integrated circuit having 6 pins is mounted in a package.
Figure 20:
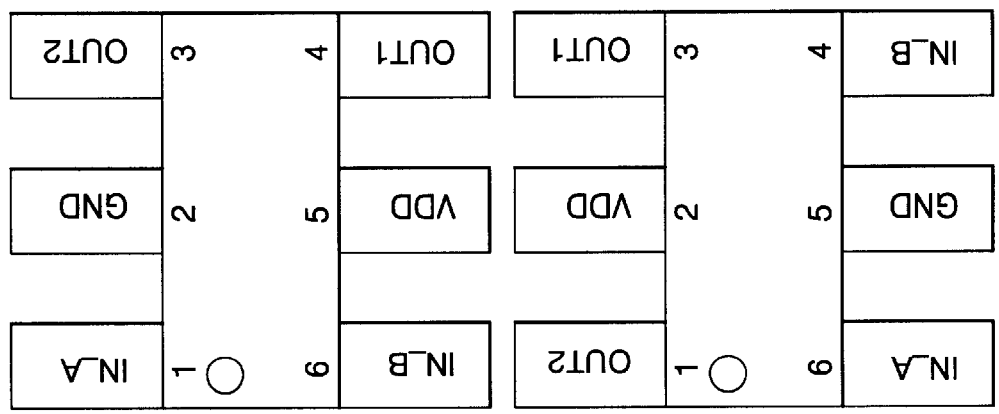
Figure 20:
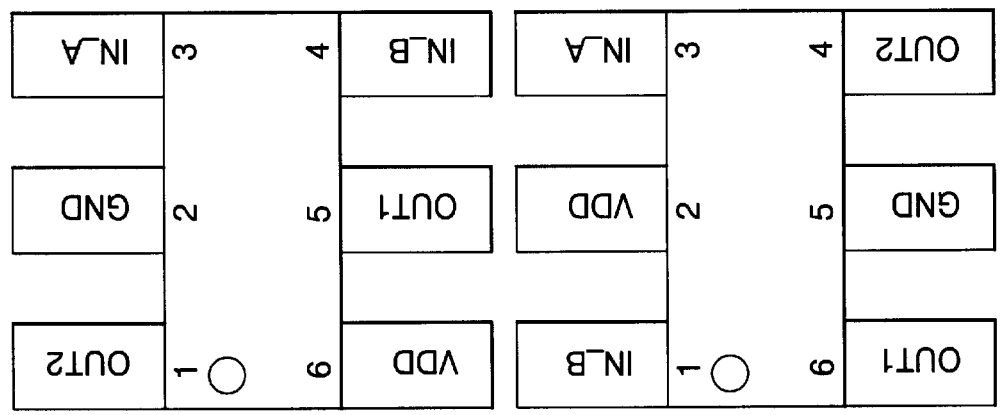

FIG. 20 is a block diagram showing various combinations of pin arrangement when an impedance comparison integrated circuit having 6 pins is mounted in a package. The input terminal 10 is not connected to an external pin to be in a floating state. The first input (IN_A) pin and the second input (IN_B) pin are disposed in the same way as those mentioned above.

Figure 21:
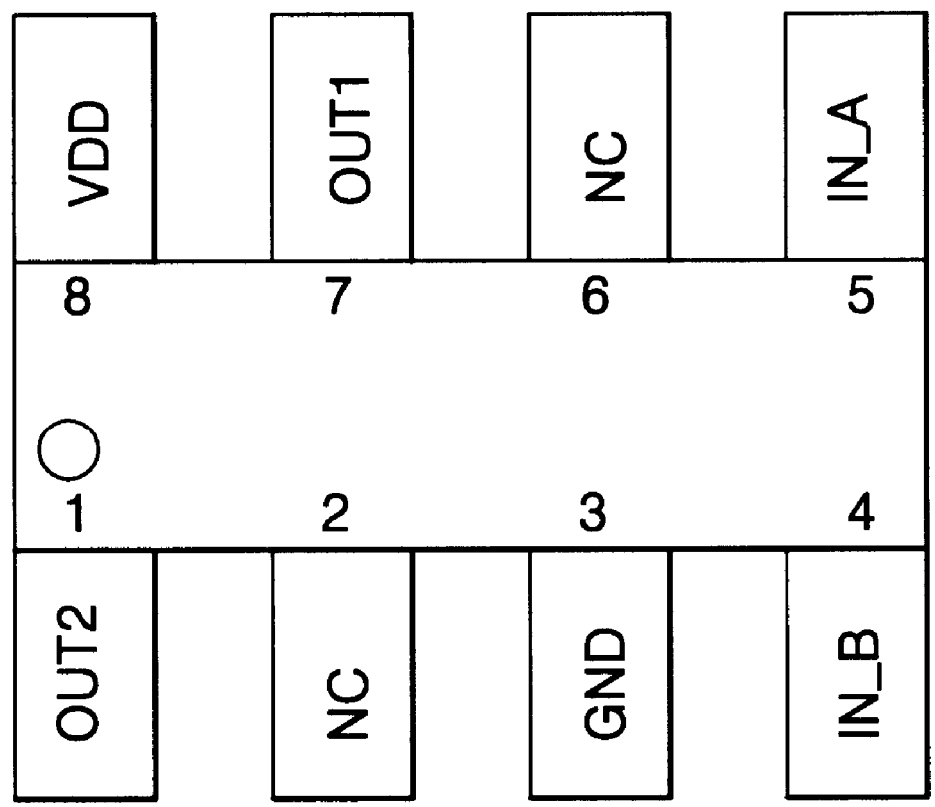
FIG. 21 is a block diagram showing various combinations of pin arrangement when an impedance comparison integrated circuit having 8 pins is mounted in a package.

FIG. 21 is a block diagram showing various combinations of pin arrangement when an impedance comparison integrated circuit having 8 pins is mounted in a package. The input terminal 10 is not connected to an external pin to be in a floating state.

Figure 22:
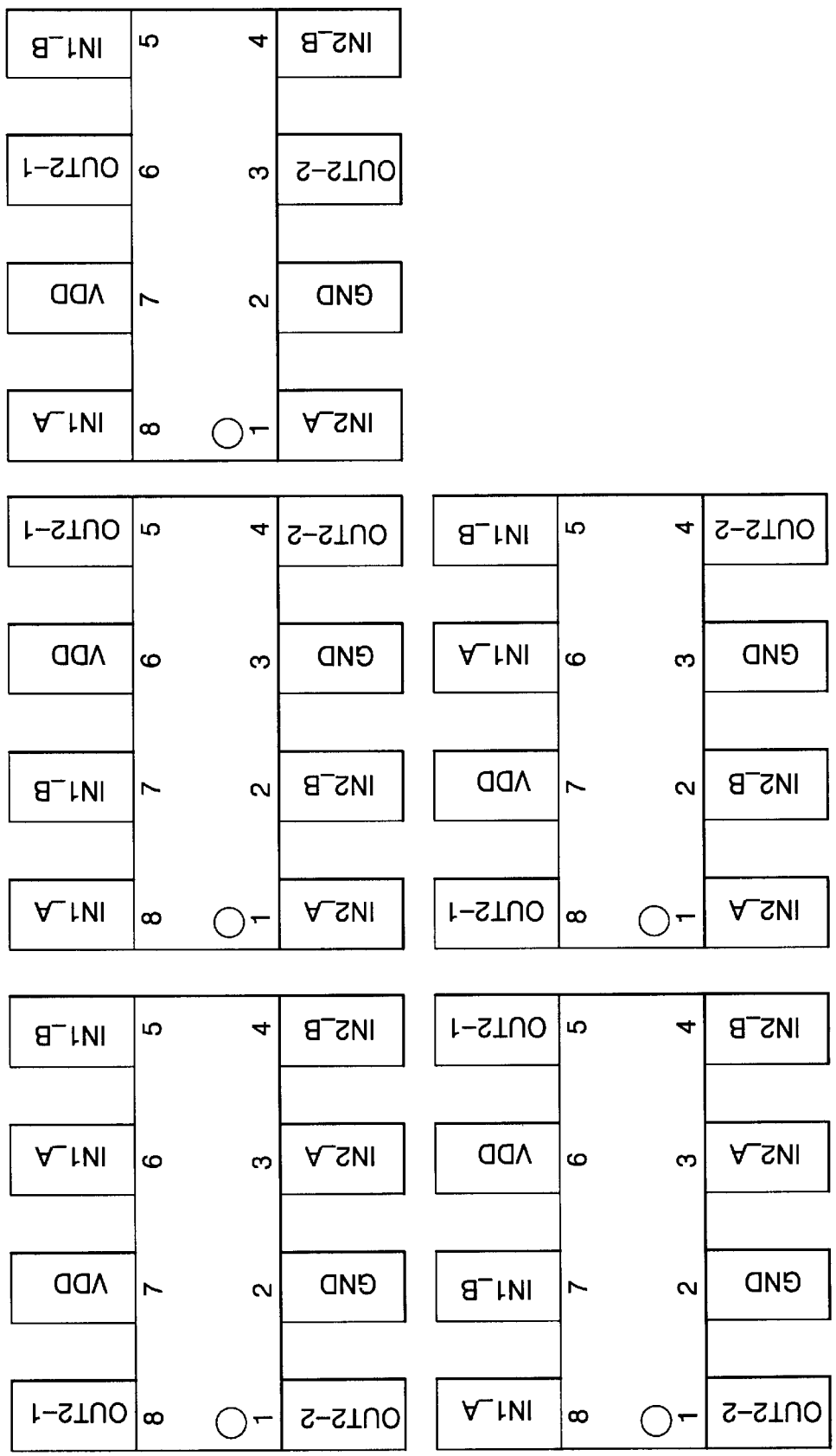
FIG. 22 is a block diagram showing various combinations of pin arrangement when two impedance comparison integrated circuits each having 8 pins are mounted in a package.

FIG. 22 is a block diagram showing various combinations of pin arrangement when two impedance comparison integrated circuits each having 8 pins are mounted in a package. The first output terminal 16 and the input terminal 10 are not connected to an external pin to be in a floating state. When a plurality pair of input pins (IN1_A, IN1_B; or IN2_A, IN2_B) exist in a package, the plurality pair of input pins are disposed to be opposite to each other in the package, the plurality pair of input pins are disposed parallel to each other at a portion of the package, or power pin or output pin are disposed between the plurality pair of input pins.

Figure 23:
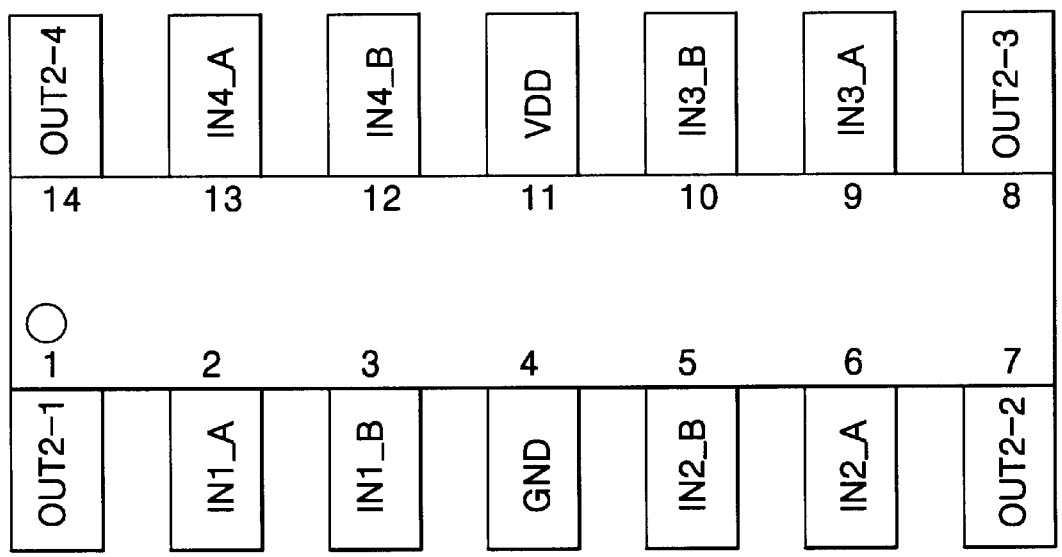
FIG. 23 is a block diagram showing various combinations of pin arrangement when four impedance comparison integrated circuits each having 14 pins are mounted in a package.
Figure 23:
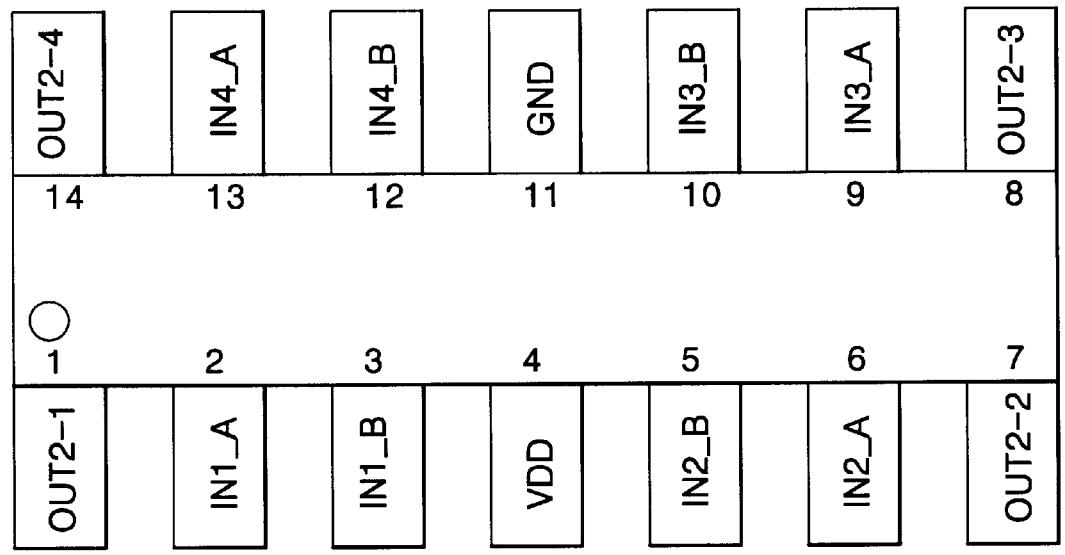

FIG. 23 is a block diagram showing various combinations of pin arrangement when four impedance comparison integrated circuits each having 14 pins are mounted in a package. The first output terminal 16 and the input terminal 10 are not connected to an external pin to be in a floating state. Each chips of two impedance comparison integrated circuits is disposed in a package. The pins of each chip are separated each other with respect to the power pin or the GND pin at a portion of the package.

Figure 24:
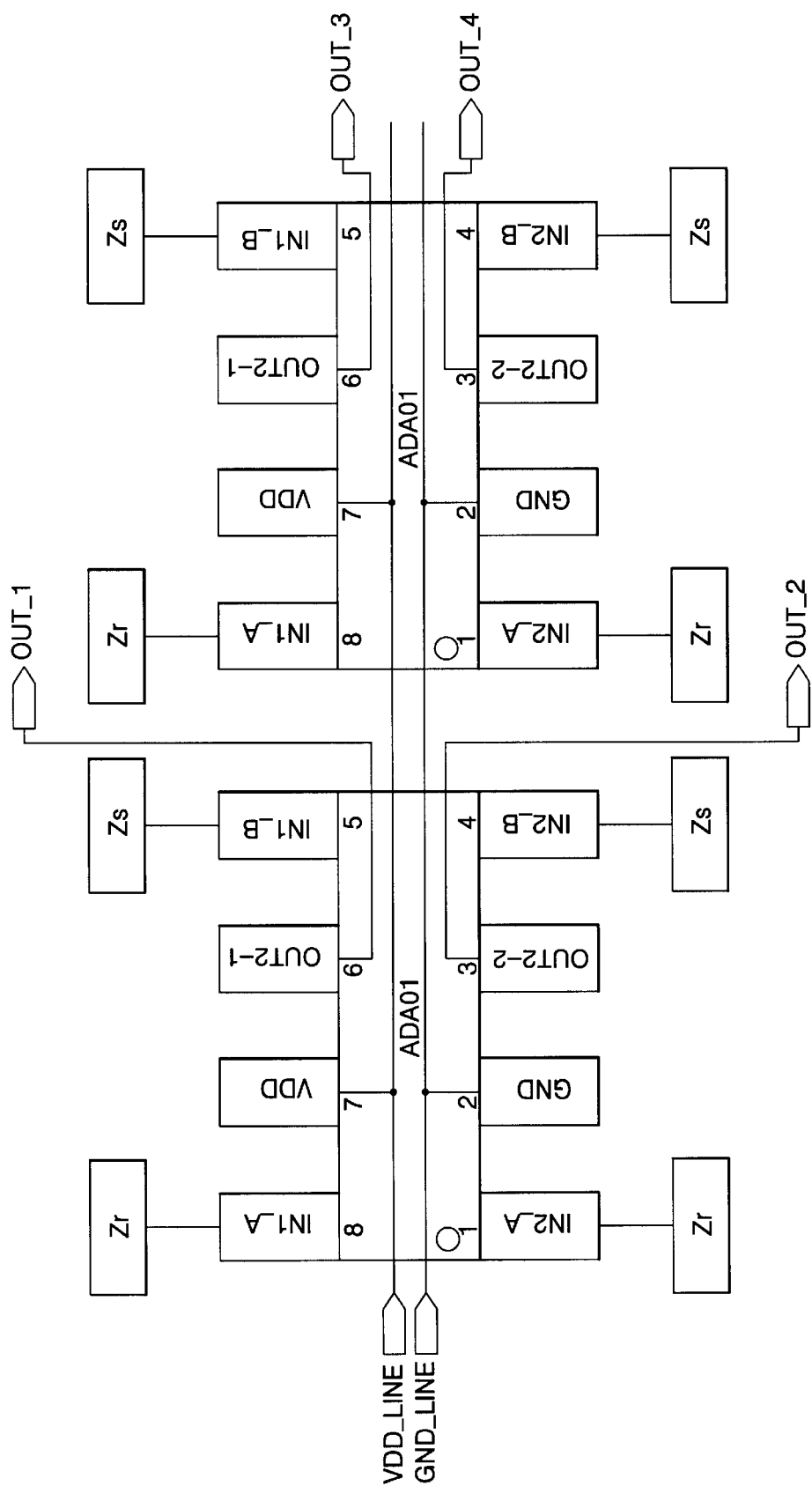
FIG. 24 is a block diagram showing layout of line pattern in a printed circuit board on which 2 impedance comparison integrated circuits each having 8 pins.

FIG. 24 is a block diagram showing layout of line pattern in a printed circuit board on which 2 impedance comparison integrated circuits each having 8 pins. According to the line pattern of FIG. 24, the difference of the parasitic impedance is minimized, so that more precise impedance comparison is possible.

Hereinafter, there is described the detailed configurations of the touch screen module having the impedance comparison integrated circuit according to a preferred embodiment of the present invention.

Figure 25:
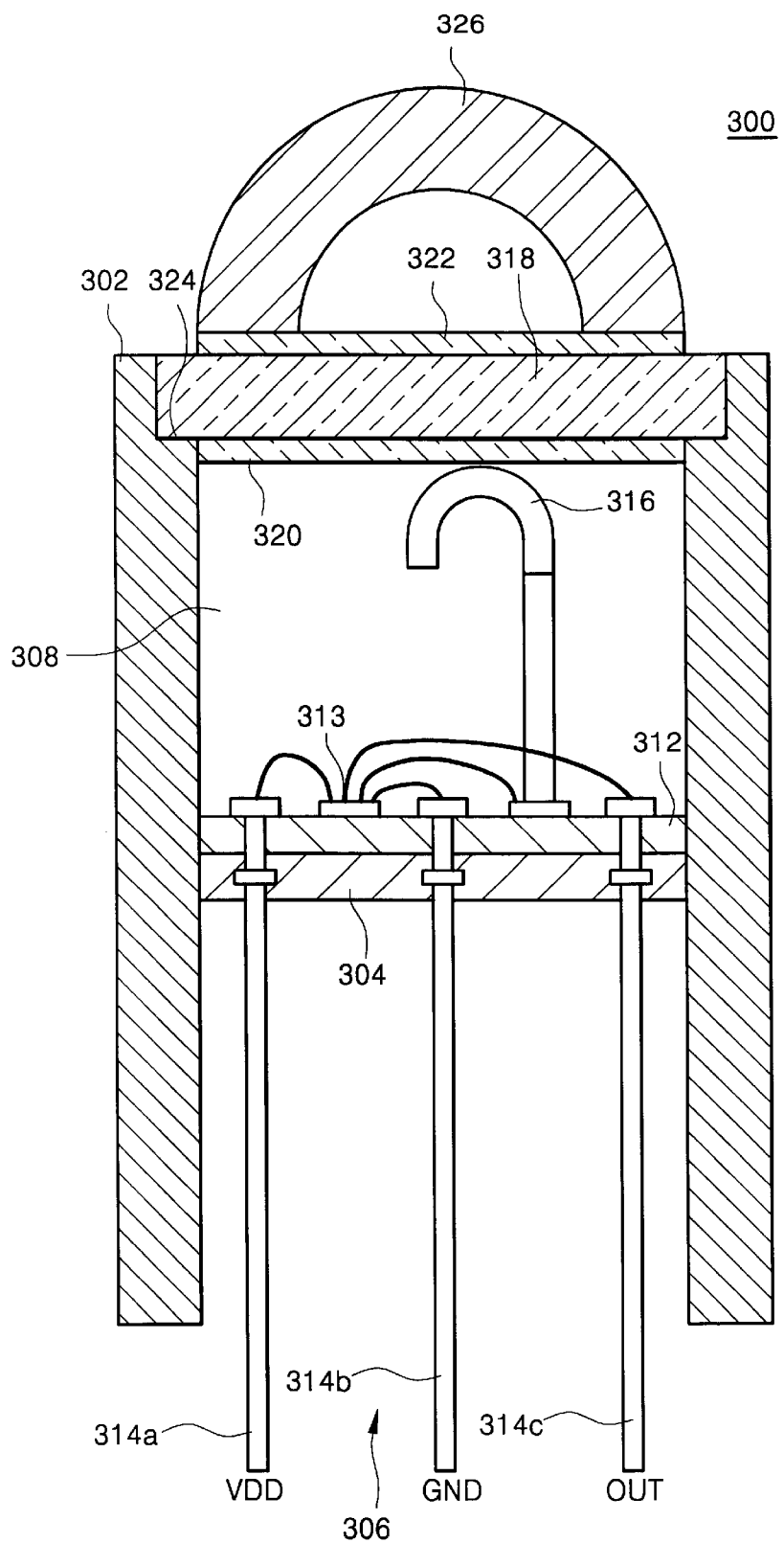
FIG. 25 is a sectional view of the touch screen module having the impedance comparison integrated circuit according to a preferred embodiment of the present invention.
Figure 26:
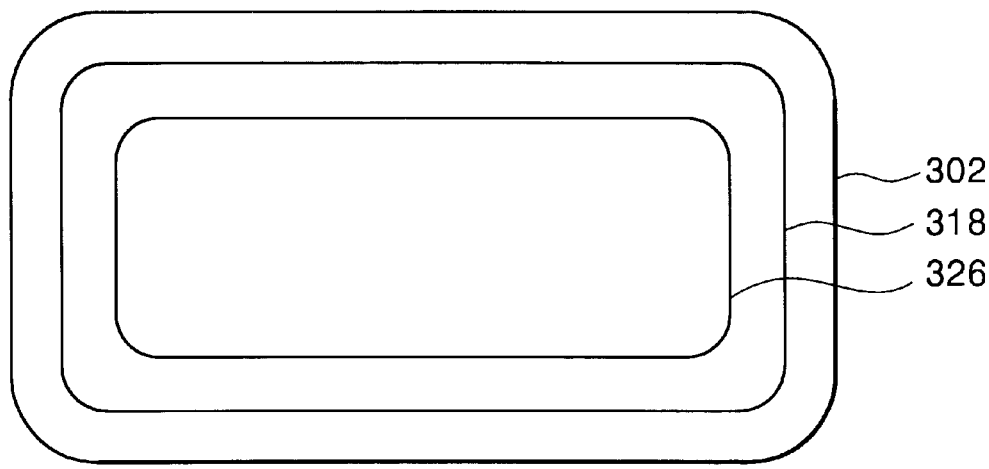
FIG. 26 is a plane view of FIG. 25.
Figure 27:
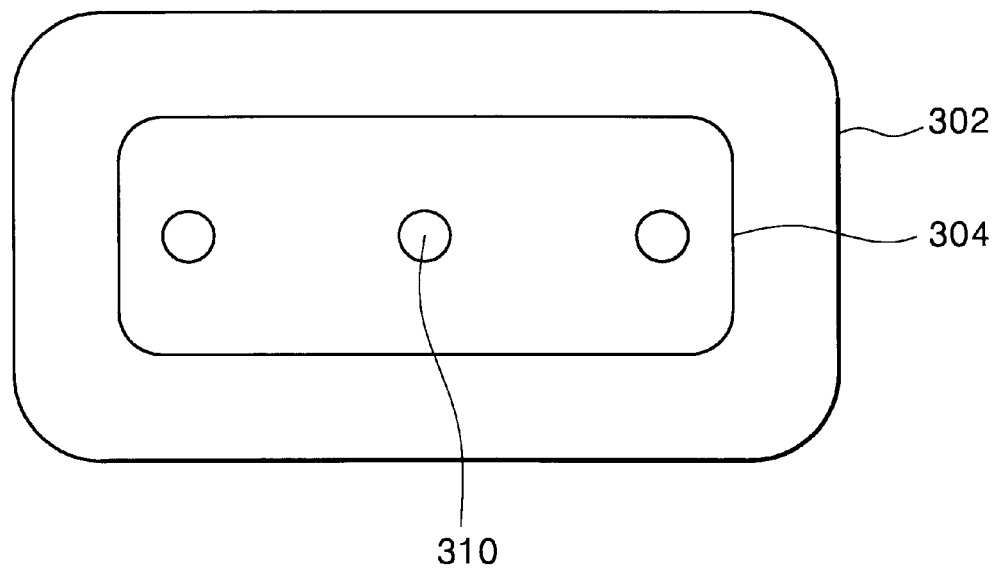
FIG. 27 is a bottom view of FIG. 25.

FIG. 25 is a sectional view of the touch screen module having the impedance comparison integrated circuit according to a preferred embodiment of the present invention, FIG. 26 is a plane view of FIG. 25, and FIG. 27 is a bottom view of FIG. 25.

The touch screen 300 of a preferred embodiment of the present invention includes a case 302 having a cubic shape. A horizontal supporting plate 304 is disposed in the case 302. Accordingly, a first space section 306 is formed from a lower surface of the horizontal supporting plate 304 to lower edges of the case 302, and a second space section 308 is formed from a upper surface of the horizontal supporting plate 304 to upper edges of the case 302. The first and second space sections (306, 308) reduce the effect of the parasitic capacitance.

Three holes 310 for lead lines are arranged in series on the horizontal supporting plate 304. A chip 313 of impedance comparison integrated circuit is mounted on the printed circuit board (PCB, 312), and is electrically connected to three lead lines (314a, 314b, 314c; hereinafter referred to 314). Also, a conductive elastic body is installed on the chip 313. The lead lines are comprised of a driving voltage (VCC) lead line 314a, a ground voltage lead line 314b and an output lead line 314c. The output lead line is disposed outermost compared other lead lines.

The three lead lines 314 are inserted through the holes 310, projected toward lower side of the case 302, and mounted on the horizontal supporting plate 304.

Preferably, the chip 313 is mounted without being packaged thereon, and the second space section 308 is filled with a mold resin to be sealed completely.

A lower electrode layer 320 and an upper electrode layer 322 are formed on an insulating substrate 318. Accordingly, the insulating substrate 318 acts as a dielectric layer between the lower and upper electrode layers (320, 322) to form a capacitor.

The insulating substrate 318 is mounted on a recess 324 formed on a upper edge, is combined by ultrasonic fusion welding, and to seal tightly inside of the case 302.

When the insulating substrate 318 is mounted thereon, the lower electrode layer 320 is electrically connected to the conductive elastic body 316. An elasticity of the conductive elastic terminal 316 can be adjusted to be electrically well contacted to the lower electrode layer 320.

A conductive elastic body 326 is attached on the upper electrode layer 322. The conductive elastic body 326 allows the upper electrode layer 322 to be tightly contacted with an external switch electrode, so that the upper electrode layer 322 is electrically connected to the external switch electrode.

Figure 28:
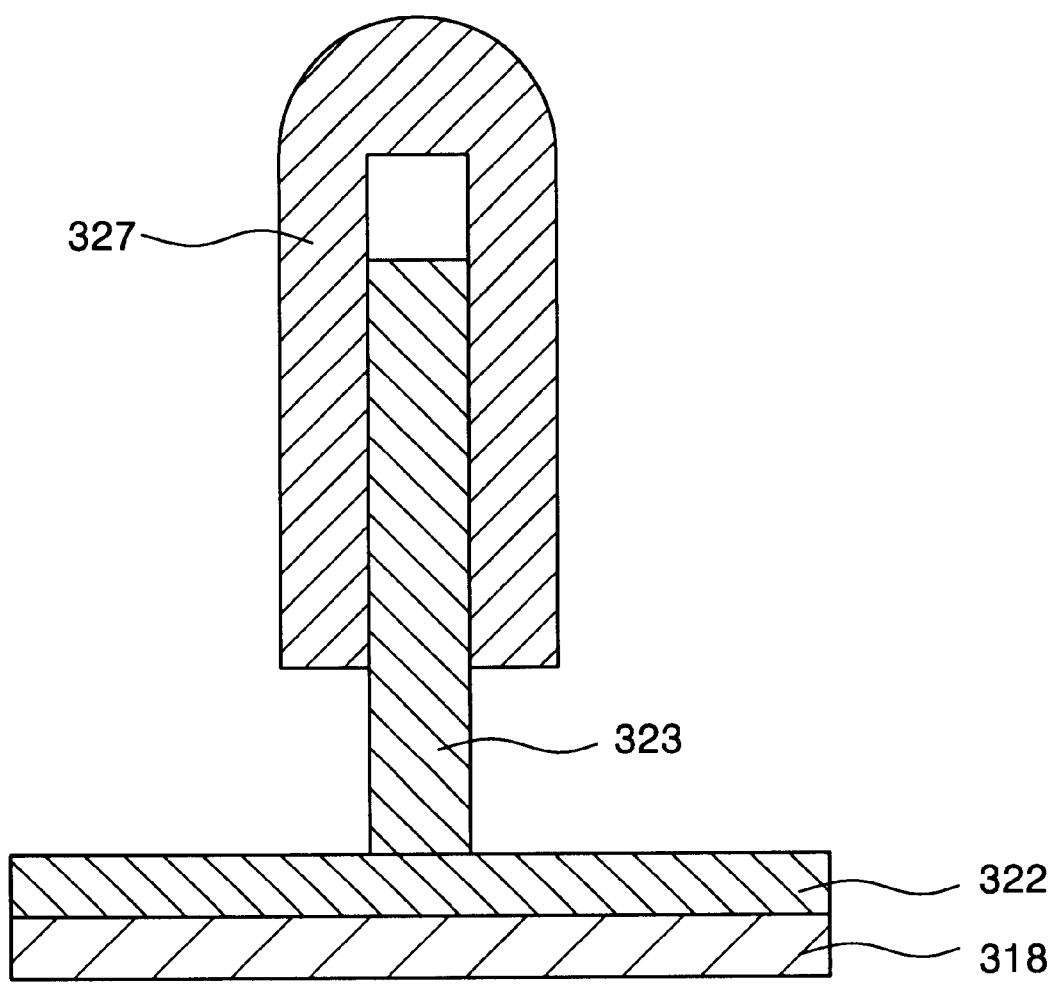
FIG. 28 is a sectional view showing a variation of the combined structure between a conductive elastic body and a upper electrode layer of FIG. 25.

FIG. 28 is a sectional view showing a variation of the combined structure between a conductive elastic body and an upper electrode layer of FIG. 25.

Referring to FIG. 28, a conductive electrode pole 323 is coupled with a central portion of the upper electrode layer 322, the conductive electrode pole 323 is covered with a conductive rubber cap 327. Accordingly, the conductive rubber cap 327 is closely contacted with the conductive electrode pole 323 corresponding to the variation of dimension of the conductive electrode pole 323, and can easily standardize components to enhance productivities. Also, according to the variation of the combined structure, conductive contact can be maintained even when external vibration is applied thereon, shock can be well absorbed, abrasion due to friction is little, and the corrosion of the electrode pole 323 can be prevented. A conductive cap can be used instead of the conductive rubber cap.

Figure 29:
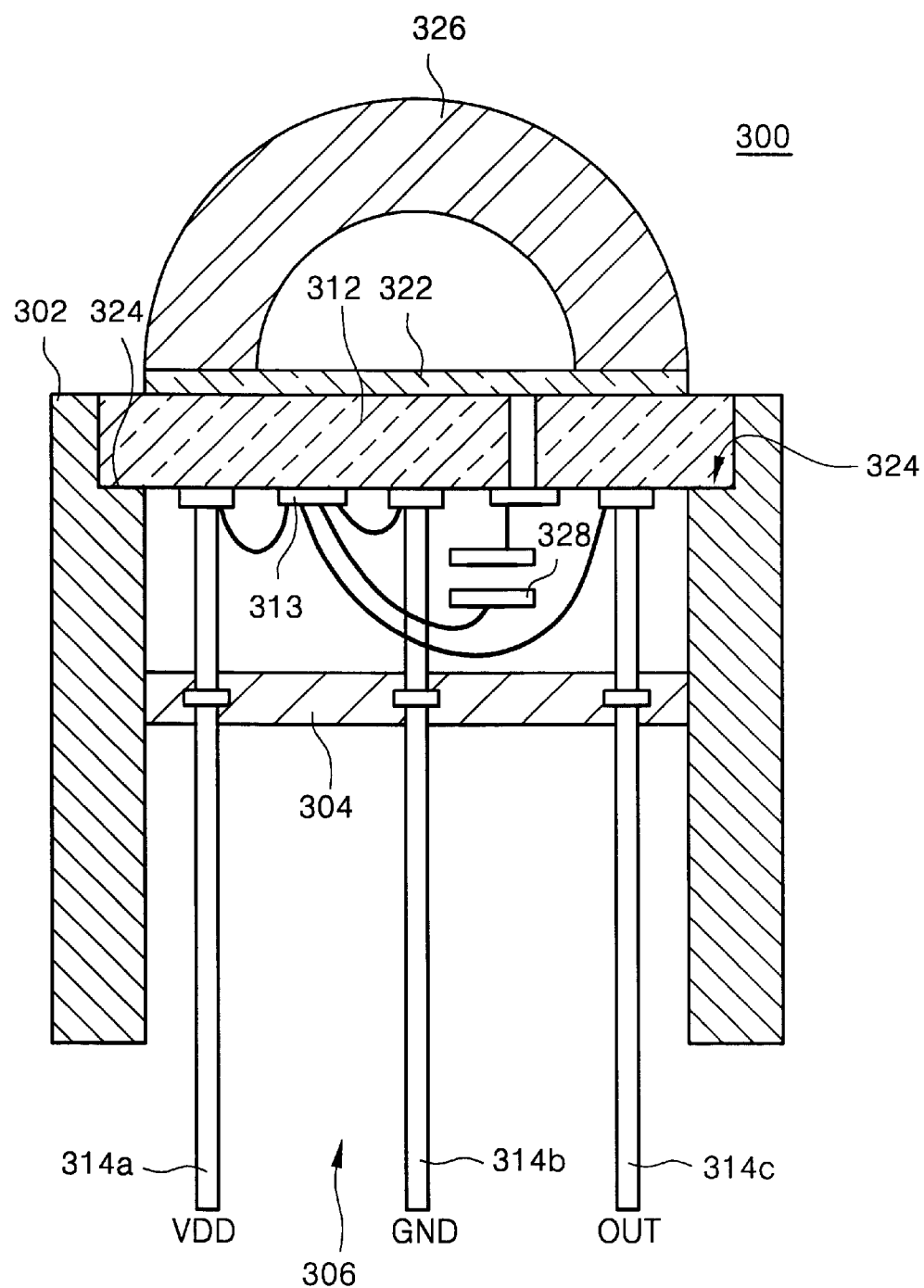
FIG. 29 is a sectional view of the touch screen module having the impedance comparison integrated circuit according to another preferred embodiment of the present invention.

FIG. 29 is a sectional view of the touch screen module having the impedance comparison integrated circuit according to another preferred embodiment of the present invention.

Referring to FIG. 29, according to the touch switch module of another preferred embodiment of the present invention, there is provided a structure where the insulating substrate 318 is removed, and the touch switch module functions as a PCB 312 and the insulating substrate 318. A chip 313, lead lines 314 and a capacitor 328 are mounted on the lower surface of the PCB 312, an electrode layer 312 is formed on the upper surface of the PCB 312, and the electrode layer 312 is connected to an end of the capacitor 328. The PCB 312 is mounted on the recess 324, is combined by ultrasonic fusion welding, and to seal tightly inside of the case 302.

A conductive elastic body 326 is attached on the electrode layer 322. The conductive elastic body 326 allows the electrode layer 322 to be tightly contacted with an external switch electrode, so that the electrode layer 322 is electrically connected to the external switch electrode.

Figure 30:
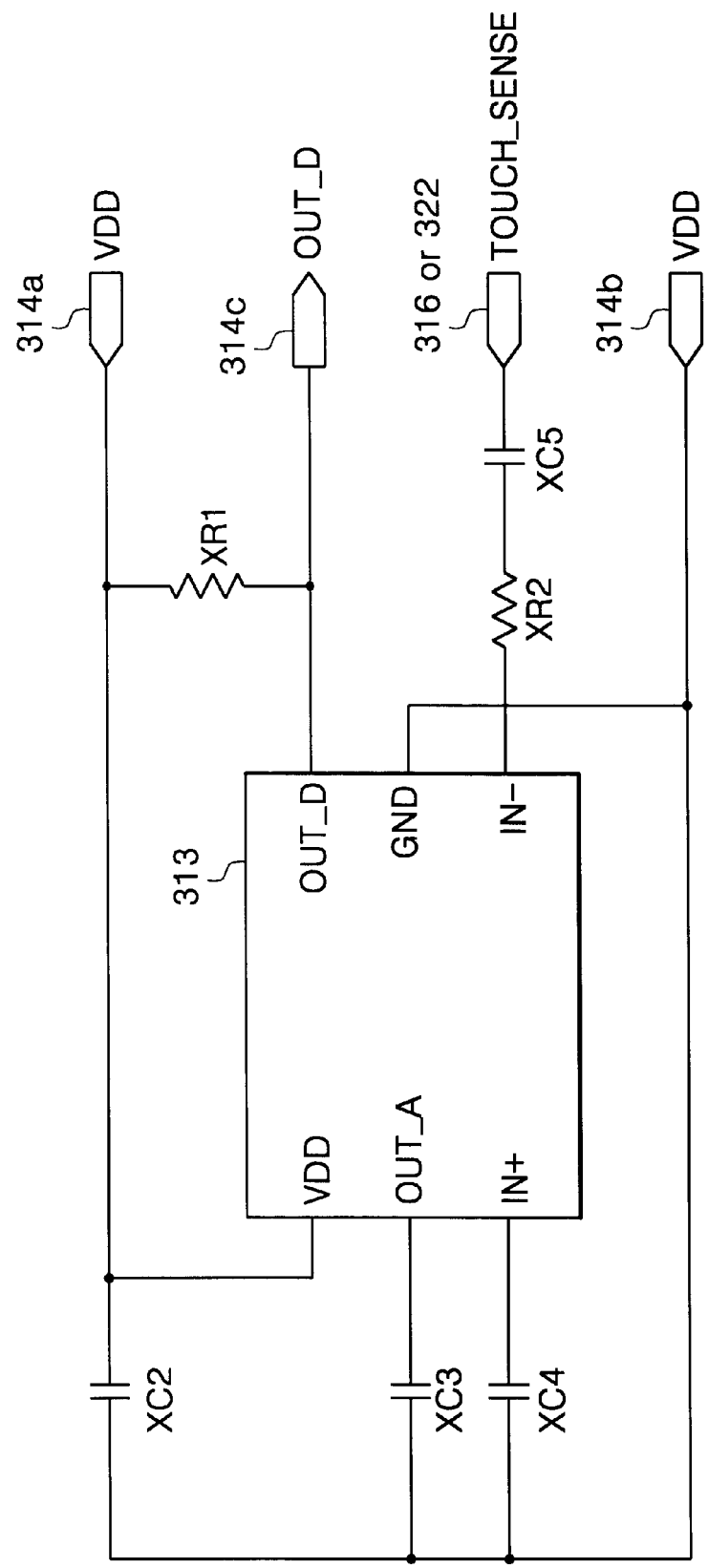
FIG. 30 is a circuit diagram of the touch screen module having the impedance comparison integrated circuit according to a preferred embodiment of the present invention.

FIG. 30 is a circuit diagram of the touch screen module having the impedance comparison integrated circuit according to a preferred embodiment of the present invention.

Referring to FIG. 30, a second output pin (OUT-D) is connected to a output lead line 314c, a ground pin (GND) is connected to a ground voltage lead line 314b, and the power pin (VDD) is connected to a power voltage lead line 314a. A conductive elastic terminal 316 or the electrode layer 322 is connected to the inverting input pin (IN−) through a resistor XR2 and a capacitor XC5. The resistor XR2 and a capacitor XC5 restrict the size of an external input current, or protect internal circuits of the chip 313 from static electricity.

The first output pin (OUT-A) is connected to the ground through a capacitor XC3 reduces noise such as chattering at a second output pin (OUT-D).

The non-inverting input pin (IN+) is connected to the ground through a capacitor XC4. The capacitor XC4 has a first capacitance greater than the capacitor XC5 connected to the inverting input pin (IN−) when the capacitor XC4 is not touched as a reference capacitor, but the capacitor XC4 has a second capacitance smaller than the capacitor XC5 when the capacitor XC4 is touched as the reference capacitor.

Preferably, the capacitance of the capacitor XC4 is an intermediate value between the first and second capacitances.

The devices externally connected to the chip 313 can be mounted in the case 302 or outside of the case 302.

This invention has been described with reference to the exemplary embodiments. It is evident, however, that many alternative modifications and variations will be apparent to those having skill in the art in light of the foregoing description. Accordingly, the present invention embraces all such alternative modifications and variations as fall within the spirit and scope of the appended claims.

For example, although above preferred embodiments discuss the impedance comparison integrated circuit designed by means of bipolar transistors, the impedance comparison integrated circuit could also be designed by means of MOS transistor to perform the same function. If the MOS transistor is used to design the impedance comparison integrated circuit, the first output circuit could be designed simply by one MOS transistor due to input characteristics of the MOS transistor.

Also, many alternative modifications and variations can be made for the combined structure of the conductive elastic body of the touch screen module.

What is claimed is:

1. An impedance comparison integrated circuit comprising:
   a current mirror means for providing a current to a first input terminal and a second input terminal, respectively, during a first interval of a period;
   a discharging means for providing a discharging path to the first and the second input terminals, respectively, during a second interval of the period;
   a differential amplification means for performing a differential amplification of signals input from the first and the second input terminals, respectively, during the first interval of the period; and
   a first output means for outputting a first output signal to a first output terminal in response to an output signal of the differential amplification means.

2. The impedance comparison integrated circuit of claim 1, wherein the current mirror means comprises:
   a first current source for generating an output current corresponding to a reference current provided by a bias resistor;
   a current sink section for providing a sink current corresponding to the output current of the first current source; and
   a second current source for providing the current to the first and the second input terminals, respectively, in response to the sink current.

3. The impedance comparison integrated circuit of claim 2, wherein the current mirror means further comprises a mode switching means, the mode switching means maintaining the current sink section at a turn-on state in a high precision mode, turning on the current sink section during the first interval of the period in a normal mode, and turning off the current sink section during the second interval of the period in the normal mode.

4. The impedance comparison integrated circuit of claim 1, wherein the differential amplification means comprises a pair of emitter coupled transistors, the transistors receiving the signals from the first and the second input terminals and generating a first and a second differential amplified current signals, respectively.

5. The impedance comparison integrated circuit of claim 4, wherein the first output means comprises:
   a first current sink means for providing a first sink current to a first node in response to the first differential amplified current signal;
   a second current sink means for providing a second sink current to a second node in response to the second differential amplified current signal;
   a current source coupled between the first node and the second node; and
   a capacitor coupled to the first node, for charging a current provided to the first node.

6. The impedance comparison integrated circuit of claim 5, further comprising:
   a buffer means for buffering an output signal of the capacitor;
   a schmitt trigger means for performing a schmitt triggering operation on an output signal of the buffer means; and
   a second output means for outputting an output signal of the schmitt trigger means to a second output terminal.

7. The impedance comparison integrated circuit of claim 6, wherein the buffer means comprises:
   a first buffer coupled to the first node, for buffering the first output signal of the first output means; and
   a second buffer coupled to the second node, for compensating a current loss of the first node due to the first buffer.

8. The impedance comparison integrated circuit of claim 6, wherein the second output means comprises an open collector type transistor.

9. The impedance comparison integrated circuit of claim 4, wherein the first output means comprises:
   a first driving means for providing a sink current corresponding to the first differential amplified current signal to the first output terminal in a normal mode, the first driving means providing the sink current corresponding to the first differential amplified current signal to the first output terminal during the first interval of the period in a high precision mode, and the first driving means providing a source current corresponding to the first differential amplified current signal to the first output terminal during the second interval in the high precision mode; and
   a second driving means for providing a source current corresponding to the second differential amplified current signal to the first output terminal in the normal mode, the second driving means providing the source current corresponding to the second differential amplified current signal to the first output terminal during the first interval of the period in the high precision mode, and the second driving means providing a sink current corresponding to the second differential amplified current signal to the first output terminal during the second interval in the high precision mode.

10. The impedance comparison integrated circuit of claim 9, further comprising:
    a clock generating means for generating a clock signal having a predetermined period;
    a timing control means for receiving the clock signal and generating a timing control signal having the first interval and the second interval;
    a control input terminal for receiving an external control signal which selects the normal mode or the high precision mode; and a mode control signal generating means for generating a mode control signal base on the external control signal and the timing control signal so as to control the normal mode and the high precision mode.

11. The impedance comparison integrated circuit of claim 6, wherein an external capacitor is coupled to the first output terminal so as to prevent a chattering of a second output signal output from the second output terminal, and so as to vary the capacitance of the capacitor coupled to the first node, to thereby control a time constant of a low pass filter.

12. The impedance comparison integrated circuit of claim 6, further comprising an external capacitor coupled to the first output terminal to output a voltage difference between the first and the second input terminals as a instant voltage signal.

13. The impedance comparison integrated circuit of claim 6, wherein the first input terminal is coupled to a sensing capacitor and the second input terminal is coupled to a reference capacitor.

14. The impedance comparison integrated circuit of claim 6, wherein the first input terminal is coupled to a sensing resistor and the second input terminal is coupled to a reference resistor.

15. The impedance comparison integrated circuit of claim 6, wherein the first input terminal and the second input terminal are symmetrically disposed in a package so as to minimize a difference of a parasitic impedance between the first input terminal and the second input terminal.

16. The impedance comparison integrated circuit of claim 6, wherein the first input terminal and the second input terminal are symmetrically disposed with respect to a power terminal in a package so as to minimize a difference of a parasitic impedance between the first input terminal and the second input terminal.

17. An impedance comparison integrated circuit comprising:
a control signal generating means for generating a timing control signal and a mode control signal in response to an external control signal and a clock signal, the timing control signal having an active interval and a non-active interval, and the mode control signal controlling a normal mode and a high precision mode;
a current mirror means for providing currents to a first input terminal and a second input terminal, respectively, in response to the timing control signal and the mode control signal;
a discharging means for providing a discharging path to the first and the second input terminals, respectively, during the non-active interval of the timing control signal;
a differential amplification means for performing a differential amplification of signals input from the first and the second input terminals, respectively, during the active interval of the timing control signal to output a first current signal and a second current signal;
a first output means for outputting a first output signal to a first output terminal, wherein the first output means provides a first sink current corresponding to the first current signal to the first output terminal and a second source current corresponding to the second current signal to the first output terminal, in a normal mode, as the first output signal, wherein the first output means provides the first sink current to the first output terminal during the active interval of the timing control signal in a high precision mode, as the first output signal, wherein the first output means provides a first source current corresponding to the first current signal to the first output terminal during the non-active interval in the high precision mode, as the first output signal, wherein the first output means provides the second source current to the first output terminal during the active interval of the timing control signal in the high precision mode, and wherein the first output means provides a second sink current corresponding to the second current signal to the first output terminal during the non-active interval in the high precision mode, as the first output signal; and
a buffer means for buffering the first output signal;
a schmitt trigger means for performing a schmitt triggering operation on an output signal of the buffer means; and
a second output means for outputting an output signal of the schmitt trigger means to a second output terminal.

18. The impedance comparison integrated circuit of claim 17, wherein the current mirror means comprises:
a first current source for generating an output current corresponding to a reference current provided by a bias resistor;
a current sink section for providing a sink current corresponding to the output current of the first current source; and
a second current source for providing the currents to the first and the second input terminals, respectively, in response to the sink current.

19. The impedance comparison integrated circuit of claim 17, wherein the buffer means comprises:
a first buffer coupled to a first node, for buffering the first output signal; and
a second buffer coupled to a second node, for compensating a current loss of the first node due to the first buffer.

20. An impedance comparison integrated circuit package comprising the impedance comparison integrated circuit chip of claim 17, wherein one chip or even number of chips is packaged in a body, and wherein first input pins and first output pins of at least one first chip are arranged in a first side of the package, and second input pins and second output pins of at least one second chip corresponding to the first chip are arranged in a second side of the package.

21. The impedance comparison integrated circuit package of claim 20, wherein the first and the second input pins are disposed symmetrically with respect to at least one pin in the first and second sides of the package.

22. The impedance comparison integrated circuit package of claim 20, wherein the first and the second input pins are disposed in parallel.

* * * * *